(12) United States Patent
Han et al.

(10) Patent No.: US 7,800,182 B2
(45) Date of Patent: Sep. 21, 2010

(54) SEMICONDUCTOR DEVICES HAVING PFET WITH SIGE GATE ELECTRODE AND EMBEDDED SIGE SOURCE/DRAIN REGIONS AND METHODS OF MAKING THE SAME

(75) Inventors: Jin-Ping Han, Fishkill, NY (US); Alois Gutmann, Poughkeepsie, NY (US); Roman Knoefler, Dresden (DE); Jiang Yan, Newburgh, NY (US); Chris Stapelmann, Tervuren (BE); Jingyu Lian, Walkill, NY (US); Yung Fu Chong, Singapore (SG)

(73) Assignees: Infineon Technologies AG, Munich (DE); Chartered Semiconductor Manufacturing, Ltd., Singapore (SG)

( * ) Notice: Subject to any disclaimer, the term of this patent is extended or adjusted under 35 U.S.C. 154(b) by 912 days.

(21) Appl. No.: 11/602,117

(22) Filed: Nov. 20, 2006

(65) Prior Publication Data

US 2008/0119019 A1    May 22, 2008

(51) Int. Cl.
*H01L 23/62* (2006.01)
(52) U.S. Cl. .................. 257/369; 257/288; 257/327; 257/368; 257/408
(58) Field of Classification Search ............ 257/288, 257/327, 368, 369, 408
See application file for complete search history.

(56) References Cited

U.S. PATENT DOCUMENTS

| 6,165,826 | A  | * | 12/2000 | Chau et al. | 438/231 |
| 6,982,474 | B2 | * | 1/2006 | Currie et al. | 257/616 |
| 7,378,305 | B2 | * | 5/2008 | Hatada et al. | 438/153 |

* cited by examiner

*Primary Examiner*—Kevin M Picardat
*Assistant Examiner*—Bac H Au
(74) *Attorney, Agent, or Firm*—Slater & Matsil, L.L.P.

(57) ABSTRACT

In a method of making a semiconductor device, a first gate stack is formed on a substrate at a pFET region, which includes a first gate electrode material. The source/drain regions of the substrate are etched at the pFET region and the first gate electrode material of the first gate stack is etched at the pFET region. The etching is at least partially selective against etching oxide and/or nitride materials so that the nFET region is shielded by a nitride layer (and/or a first oxide layer) and so that the spacer structure of the pFET region at least partially remains. Source/drain recesses are formed and at least part of the first gate electrode material is removed by the etching to form a gate electrode recess at the pFET region. A SiGe material is epitaxially grown in the source/drain recesses and in the gate electrode recess at the pFET region. The SMT effect is achieved from the same nitride nFETs mask.

17 Claims, 20 Drawing Sheets

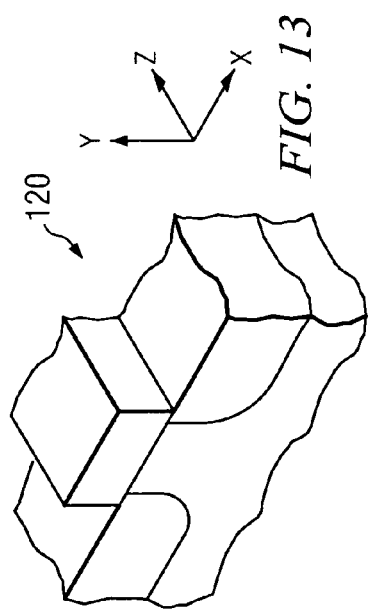
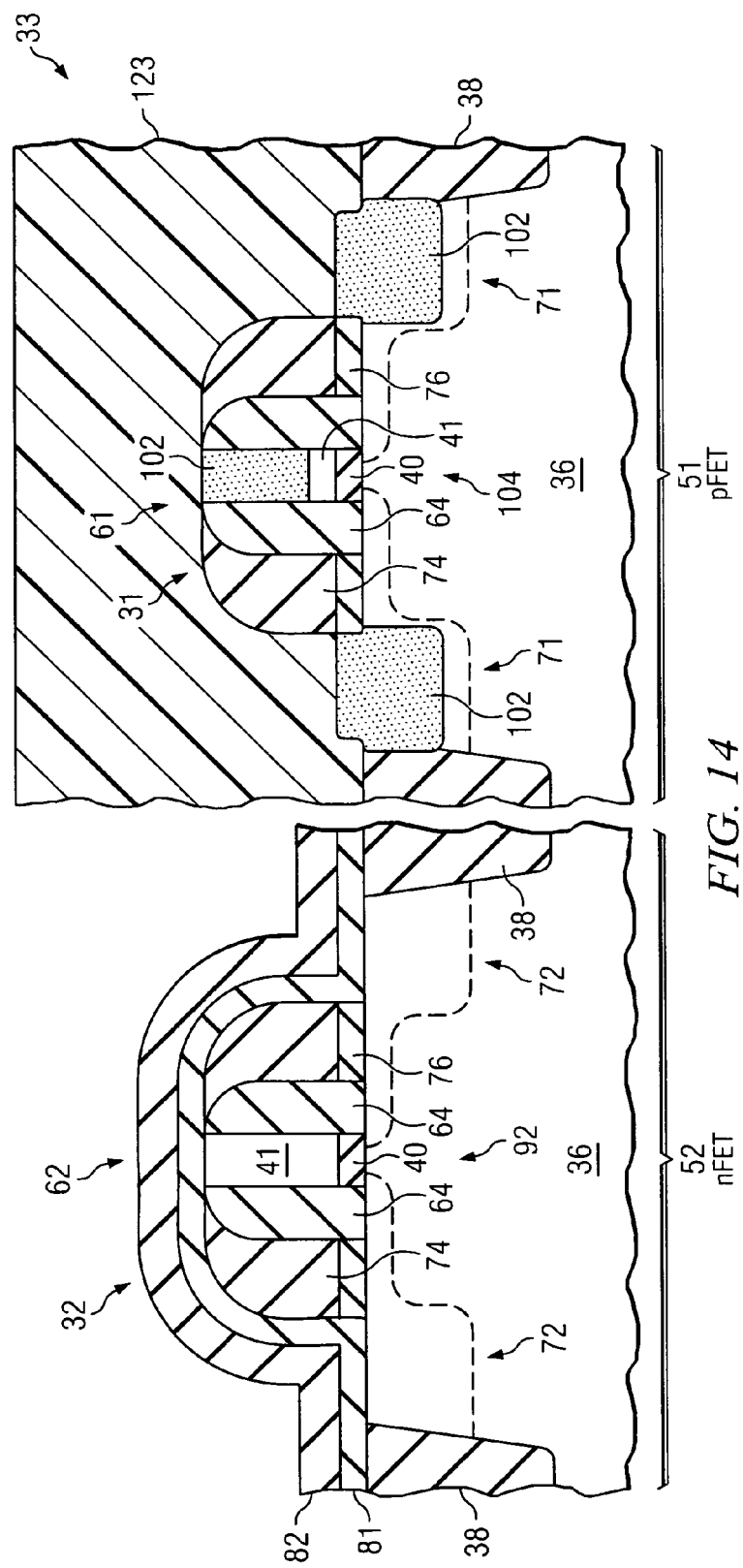
FIG. 13
FIG. 14

SEMICONDUCTOR DEVICES HAVING PFET WITH SIGE GATE ELECTRODE AND EMBEDDED SIGE SOURCE/DRAIN REGIONS AND METHODS OF MAKING THE SAME

TECHNICAL FIELD

The present invention generally relates to the manufacturing of semiconductor devices. In one aspect it relates more particularly to the manufacturing of semiconductor devices having a pFET with a silicon germanium (SiGe) gate electrode and embedded SiGe source/drain regions.

BACKGROUND

Many semiconductor devices, such as memory devices, utilize both n-type field effect transistors (nFETs) and p-type field effect transistors (pFETs). One example of a memory device that uses both nFETs and pFETs is a static random access memory (SRAM) device. A typical SRAM device includes arrays of thousands of SRAM cells. Each SRAM cell may have four or six transistors (for example). A commonly used SRAM cell is a six-transistor (6T) SRAM cell. A 6T SRAM cell has two pFETs interconnected with four nFETs.

As technology progresses, the size of individual components and portions of semiconductor devices are continually being scaled down. This increases device speeds and allows for smaller integrated circuit chips to be produced. It also allows for more devices and even multiple systems to be placed on each chip. In turn, this allows consumer products and other equipment to be made smaller, lighter, and yet more powerful than previous products. It also allows for more features and functionality to be included in a single product (e.g., cell phones with cameras and massive storage for information, music, images, and videos).

SiGe has been known as a very promising material for scaled down CMOS technology. Embedded SiGe has been successfully integrated in source/drain regions of transistors as stressors to enhance the performance of devices, the devices based on such concept has been mass-productive. However, integrating more stressor components together such as Stress Memory Technology (SMT) for nFETs and Dual Stress Liners (DSL) for both pFETs and nFETs have been challenging. Hence, there is a need to find new ways to incorporate SiGe into transistor structures, while also reducing the complexity of manufacturing processes to improve or maintain manufacturing efficiency, device reliability, and production yield.

SUMMARY OF THE INVENTION

In accordance with one aspect of the present invention, a method of making a semiconductor device is provided. This method includes the following steps described in this paragraph. The order of the steps may vary, may be sequential, may overlap, may be in parallel, and combinations thereof, if not otherwise stated. A first gate stack is formed on a substrate at a pFET region. The first gate stack includes a first gate electrode material overlying a gate dielectric material. A second gate stack is formed on the substrate at an nFET region. Spacer structures are formed and ions are implanted into the source/drain regions of the substrate at the nFET and pFET regions. A tensile-stress-inducing mask layer is formed over the substrate, the spacer structures, and the gate stacks. The tensile-stress-inducing mask layer is removed from the pFET region, while retaining the first oxide layer over the nFET region using a first patterned mask layer. The source/drain regions of the substrate are etched at the pFET region and the first gate electrode material of the first gate stack is etched at the pFET region. The etching is at least partially selective against etching the tensile-stress-inducing mask layer so that the nFET region is shielded, and the etching is at least partially selective against etching materials of the spacer structure of the pFET region so that the spacer structure of the pFET region at least partially remains. Source/drain recesses are formed by the etching in the source/drain regions of the substrate at the pFET region. At least part of the first gate electrode material is removed by the etching from the first gate stack to form a gate electrode recess. A SiGe material is formed (preferably by epitaxially growth) in the source/drain recesses and in the gate electrode recess at the pFET region.

In accordance with another aspect of the present invention, a semiconductor device including a pFET transistor is provided. The pFET transistor includes an embedded SiGe source/drain material formed in source/drain recesses at source/drain regions of a substrate for the pFET transistor. The pFET transistor also includes a first gate stack with an embedded SiGe gate electrode material, where the embedded SiGe gate electrode material is a same material as the embedded SiGe source/drain material because the embedded SiGe gate electrode material and the embedded SiGe source/drain material were grown during a same processing step, the crystallinity may differ though due to the different feature of the underlayer material which SiGe is grown on. A spacer structure extends along sidewalls of the first gate stack. The first gate stack may further include a first gate stack material formed on a gate dielectric material, wherein the embedded SiGe gate electrode material is grown on the first gate stack material, and wherein the embedded SiGe gate electrode material is thicker than the first gate stack material. The spacer structure may include: an oxide spacer extending along the sidewalls of the first gate stack; an oxide layer formed on the substrate adjacent to the oxide spacer; and a nitride spacer formed on the oxide layer and extending along sidewalls of the oxide spacer, such that the oxide spacer is located between the first gate stack and the nitride spacer and such that the oxide layer is located between the nitride spacer and the substrate.

The foregoing has outlined rather broadly features of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which:

FIG. 13 shows a simplified schematic of a transistor with Cartesian coordinates drawn thereon;

FIGS. 14-17 show some illustrative steps for a second illustrative method embodiment of the present invention;

DETAILED DESCRIPTION OF ILLUSTRATIVE EMBODIMENTS

Figure 1:
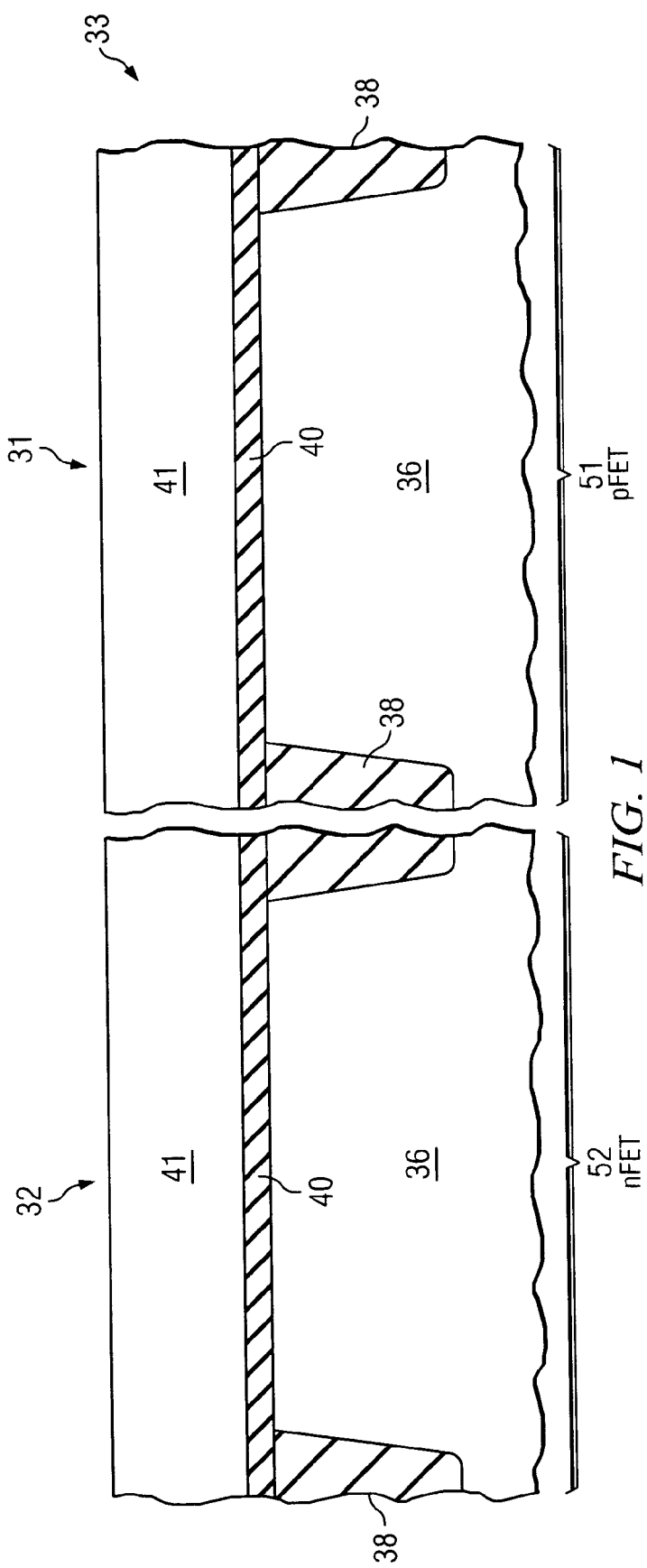
FIGS. 1-12 show some illustrative steps of a first illustrative method embodiment of the present invention.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Generally, an embodiment of the present invention provides a semiconductor device structure for nFETs and pFETs, where the pFETs have a SiGe gate electrode and embedded SiGe source/drain regions, and methods of making the same. A first illustrative and currently preferred method embodiment of the present invention will be described first with reference to FIGS. 1-12. Then, a second illustrative method embodiment will be described with reference to FIGS. 14-17. Next, third and fourth illustrative method embodiments will be described with reference to FIGS. 18 and 19, respectively. A fifth illustrative method embodiment will then be described with reference to FIGS. 20-21.

Turning now to the description of the first illustrative method embodiment, FIGS. 1-12 will be described. Illustrative method steps and intermediate structures of a pFET 31 and an nFET 32 for a semiconductor device 33 (e.g., a logic device or a memory device) are shown. Not every method step and intermediate structure of the pFET 31 and nFET 32 of the semiconductor device 33 will be shown for purposes of simplifying the drawings. It will be understood by one of ordinary skill in the art that there will be other method steps and intermediate structures that need not be shown to describe the method embodiment. It will also be understood by one of ordinary skill in the art that there will typically be thousands of pFETs and nFETs in a semiconductor device, even though only two transistors are shown herein for purposes of simplifying the drawings.

FIG. 1 is a cross-section view showing an initial structure for the first illustrative method embodiment of the present invention. At this stage shown in FIG. 1, a substrate 36 of the semiconductor device 33 has isolation regions 38 formed therein to define boundaries of the diffusion regions for the pFET 31 and nFET 32, shallow trench isolation (STI) in this example. It should be noted that although the pFET 31 and nFET 32 are shown next to each other, it will be understood by one of ordinary skill in the art that the pFET 31 and nFET 32 may or may not be aligned, and they may or may not be directly adjacent to each other (i.e., there may be other structures or devices there between).

In FIG. 1, a gate dielectric material 40 and a first gate electrode material 41 are formed on the substrate 36. In this example, the first gate electrode material 41 is polycrystalline silicon. As will be discussed further below, the first gate electrode material 41 may be any suitable material, including (but not limited to): polycrystalline silicon, polycrystalline SiGe, semiconductor material, metal, or combinations thereof, for example. The first gate electrode material 41 is overlying the gate dielectric material 40. In an embodiment, the gate dielectric material 40 may be a single homogenous layer or multiple laminate layers of dielectric material, for example. The dielectric material used for the gate dielectric material is preferably high-k dielectric material, and may be any suitable dielectric material (including functional materials, such as piezoelectric, paraelectric, ferroelectric materials, currently known or later developed). For purposes of discussion, the right side of the cross-section figures will be referred to as the pFET region 51 and the left side will be referred to as the nFET region 52. A pFET 31 will be formed in the pFET region 51, and an nFET 32 will be formed in the nFET region 52. The substrate 36 for each region may differ in its doping (e.g., N well or P well formed therein), and in other embodiments (not shown), the substrate may differ in structure and/or materials for each region (e.g., silicon-on-insulator (SOI) substrate structure, Germanium-on-insulator (GOI), III-V (II-VI) group compound semiconductor, compound semiconductor on silicon or on SOI).

Figure 2:
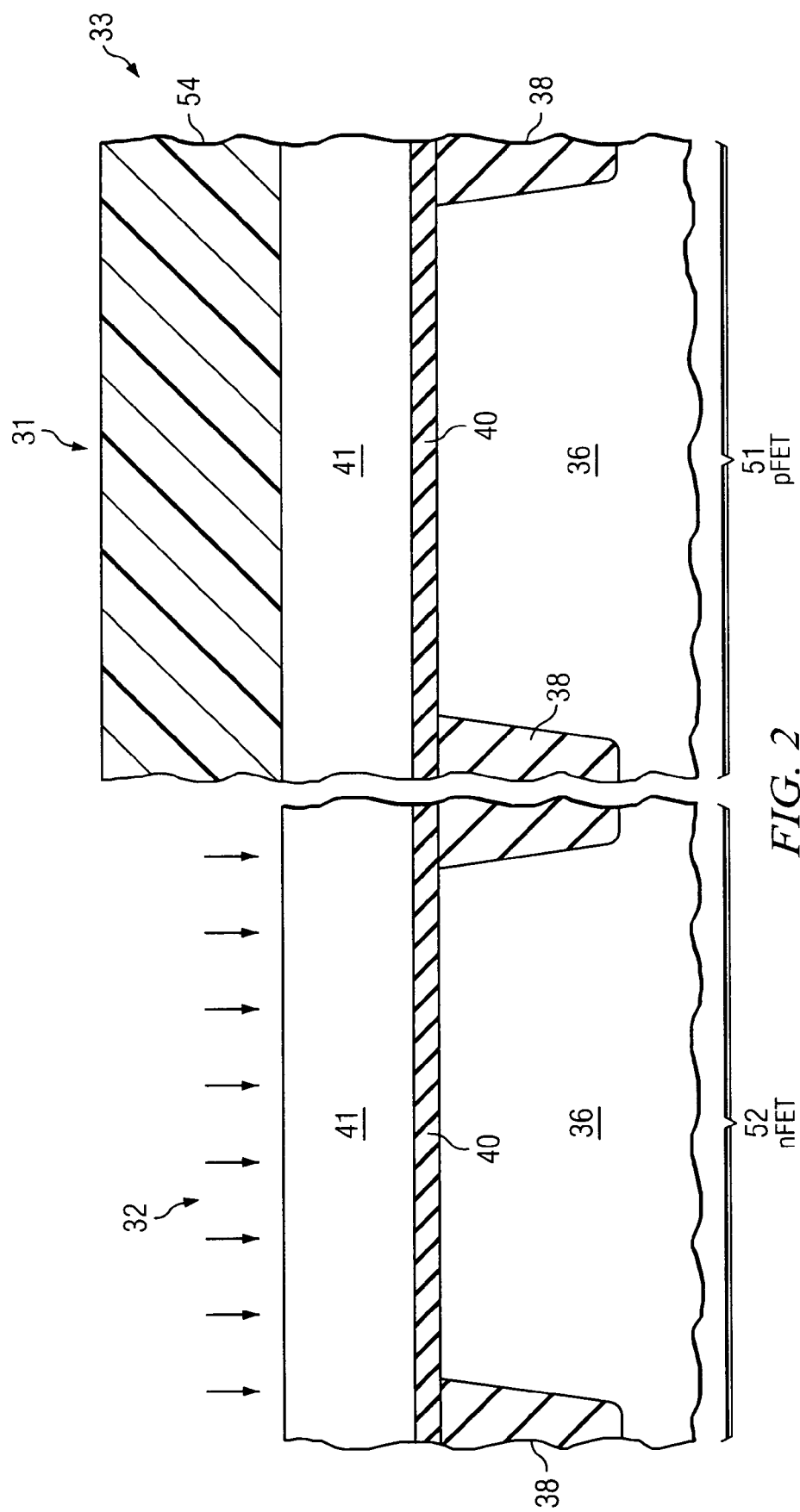

In FIG. 2, the pFET region 51 is covered by a patterned mask 54 (e.g., photoresist material), while the first gate electrode material 41 is doped in the nFET region 52. In another embodiment (not shown), the pFET region 51 may be doped along with the nFET region 52, thereby eliminating the need for forming the patterned mask 54. This may be the case in an embodiment where the first gate electrode material 41 is completely removed in the pFET region 51 at a later step, for example. The doping step shown in FIG. 2 is sometimes referred to as a pre-dope step. After this pre-dope step, the patterned mask 54 will be removed.

Figure 3:
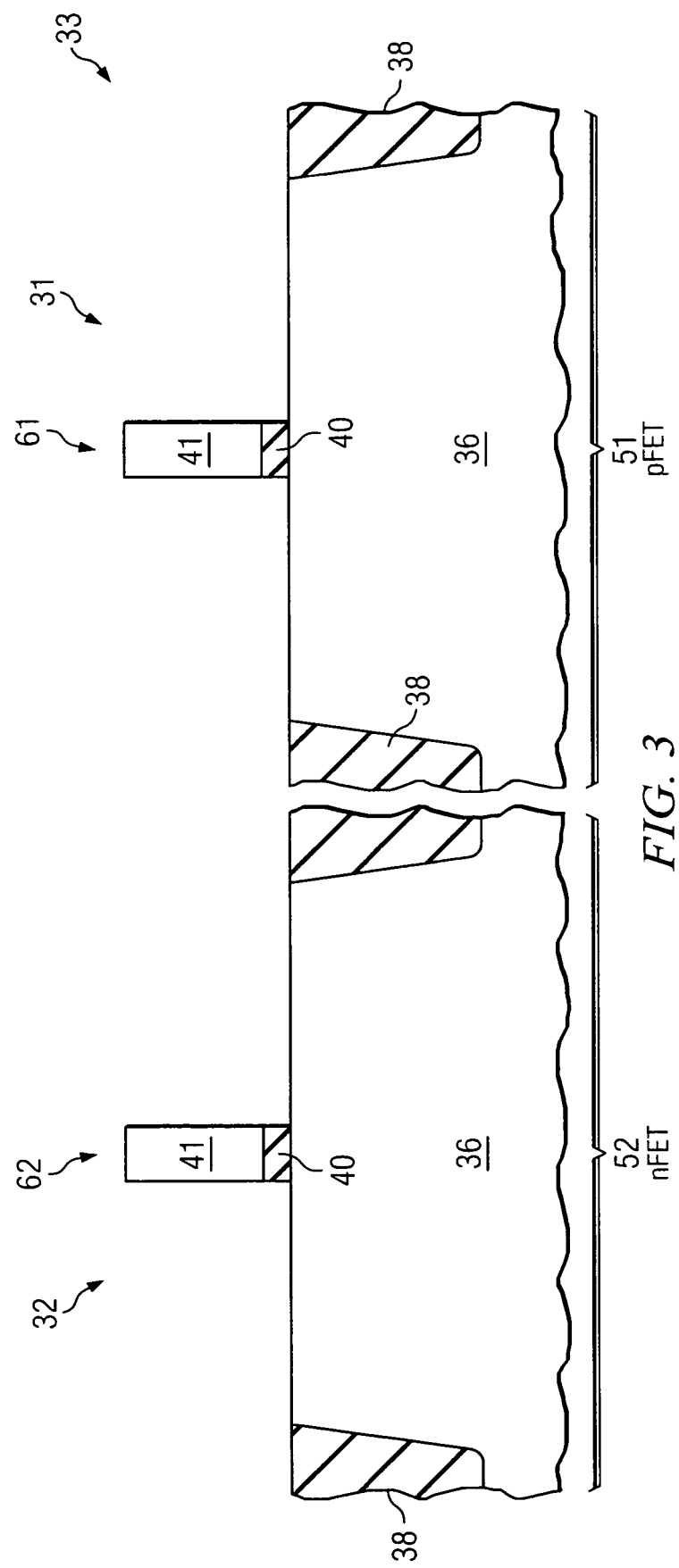
Figure 4:
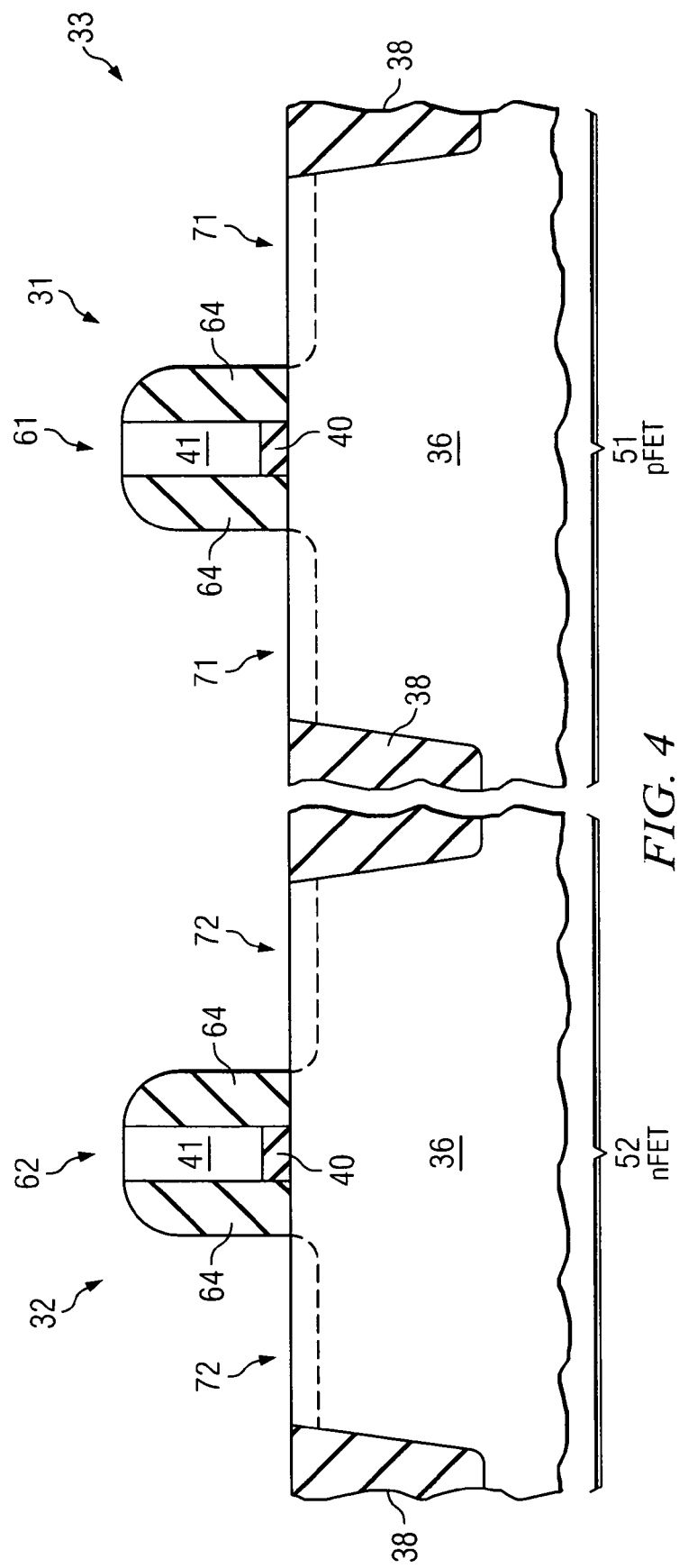

In FIG. 3, a first gate stack 61 in the pFET region 51 and a second gate stack 62 in the nFET region 52 are formed. These gate stacks 61, 62 may be formed using any currently known or later developed method of forming a gate stack structure. For example, the gate stacks 61, 62 may be formed using conventional photolithography and anisotropic etching steps. At this stage, each of the first gate stack 61 and the second gate stack 62 includes the first gate electrode material 41 overlying the gate dielectric material 40. Next, as shown in FIG. 4, oxide spacers 64 are formed along the sidewalls of the gate stacks 61, 62. In this embodiment, a polysilicon re-oxidation step and a low temperature oxide (LOT) deposition (e.g., by chemical vapor deposition (CVD)) are performed to form the oxide material of the oxide spacers 64. A rapid thermal anneal (RTA) step may be performed prior to etching the oxide material of the oxide spacers 64. This RTA step may be used to activate the pre-dope in the polysilicon for the first gate electrode material 41, when it is appropriate to do so. Then, an anisotropic etching process (e.g., reactive ion etch (RIE)) is performed to form the oxide spacer structures 64 shown in FIG. 4. After forming the oxide spacer structures 64 shown in FIG. 4, a halo or extension implant is performed, by implanting ions into the source/drain regions 71, 72 of the substrate 36 at the pFET 51 and nFET 52 regions to a first implanting depth. Although not shown, the pFETs (nFETs) are typically blocked by photo resist when performing nFETs (pFETs) implant. This implanting is performed in alignment with the oxide spacer structures 64 and is preferably a shallow implant.

Figure 5:
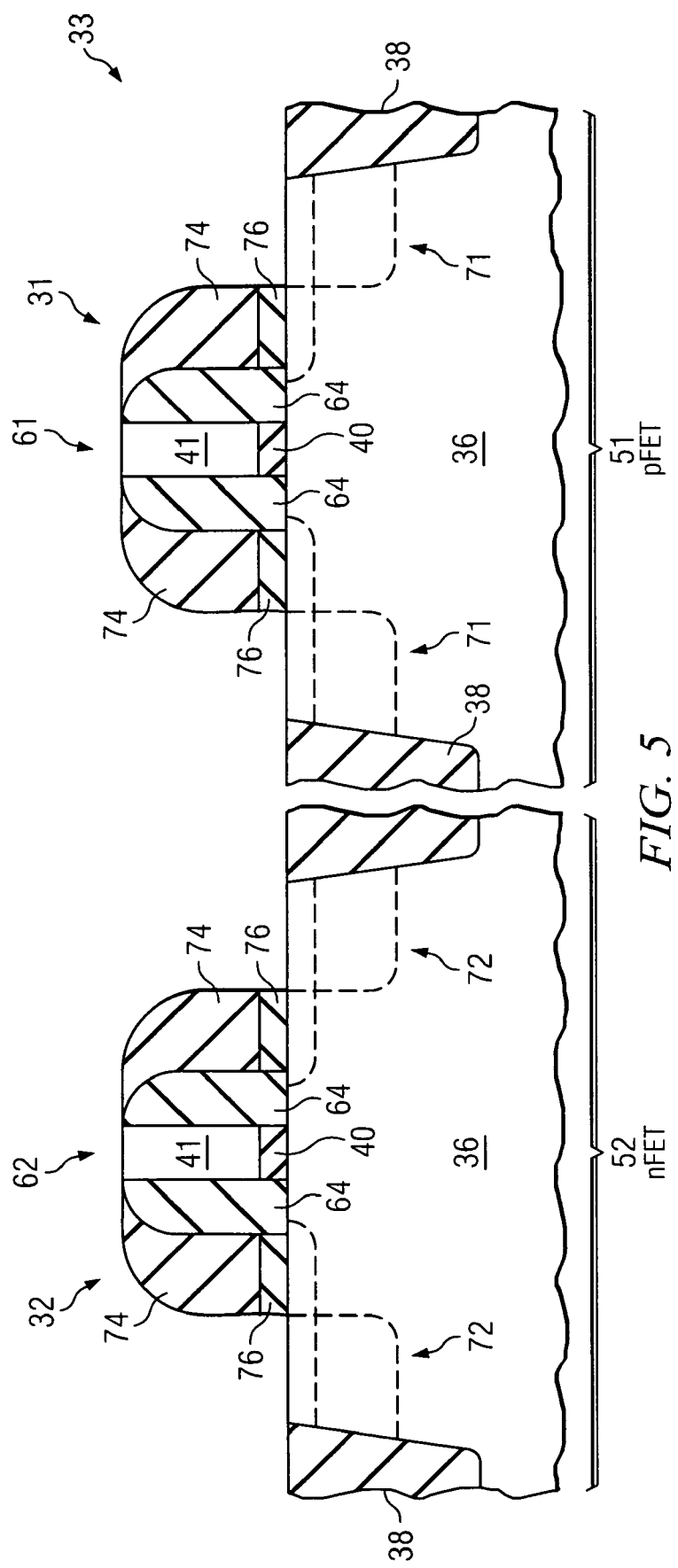

Referring now to FIG. 5, nitride spacer structures 74 have been formed on the sidewalls of the LTO spacers 64, so that the LTO spacers 64 are located between the nitride spacers 74 and the gate stacks 61, 62. But first, it may be desirable to form an LTO layer 76 over the substrate 36, the first gate stack 61, and the second gate stack 62, prior to forming the nitride material that will be used to form the nitride spacers 74. This LTO layer 76 may be used as an etch stop or etch buffer while etching the nitride material to form the nitride spacers 74. Hence, part of the LTO layer 76 may remain between the nitride spacers 74 and the substrate 36, as shown in FIG. 5. To form the nitride spacers 74, a RIE etch may be used to etch the nitride material in an anisotropic manner (e.g., selective against etching oxide materials and stopping on the LTO layer 76). Then, the LTO layer 76 may be removed from over the source/drain regions 71, 72 using a wet etch, for example. After forming the nitride spacers 74, a source/drain implant is performed, by implanting ions respectively into the source/drain regions 71, 72 of the substrate 36 at the pFET 51 and nFET 52 regions to a second implanting depth. Although not shown, the pFETs (nFETs) are typically blocked by photo resist when performing nFETs (pFETs) implant. The pFETs source/drain (S/D) implant is optional because pFETs S/D area may be recessed and filled with in-situ p-dopant (such as B) doped SiGe materials. Typically, the second implanting depth will be greater than the first implanting depth. However, any suitable doping pattern and gradient (currently known or later developed) may be used in a method embodiment of the present invention. Also, any suitable spacer structures, spacer sizes, spacer materials, and number of spacer structures may be used in an embodiment of the present invention, along with any suitable number of implanting steps for doping the source/drain regions 71, 72.

Figure 6:
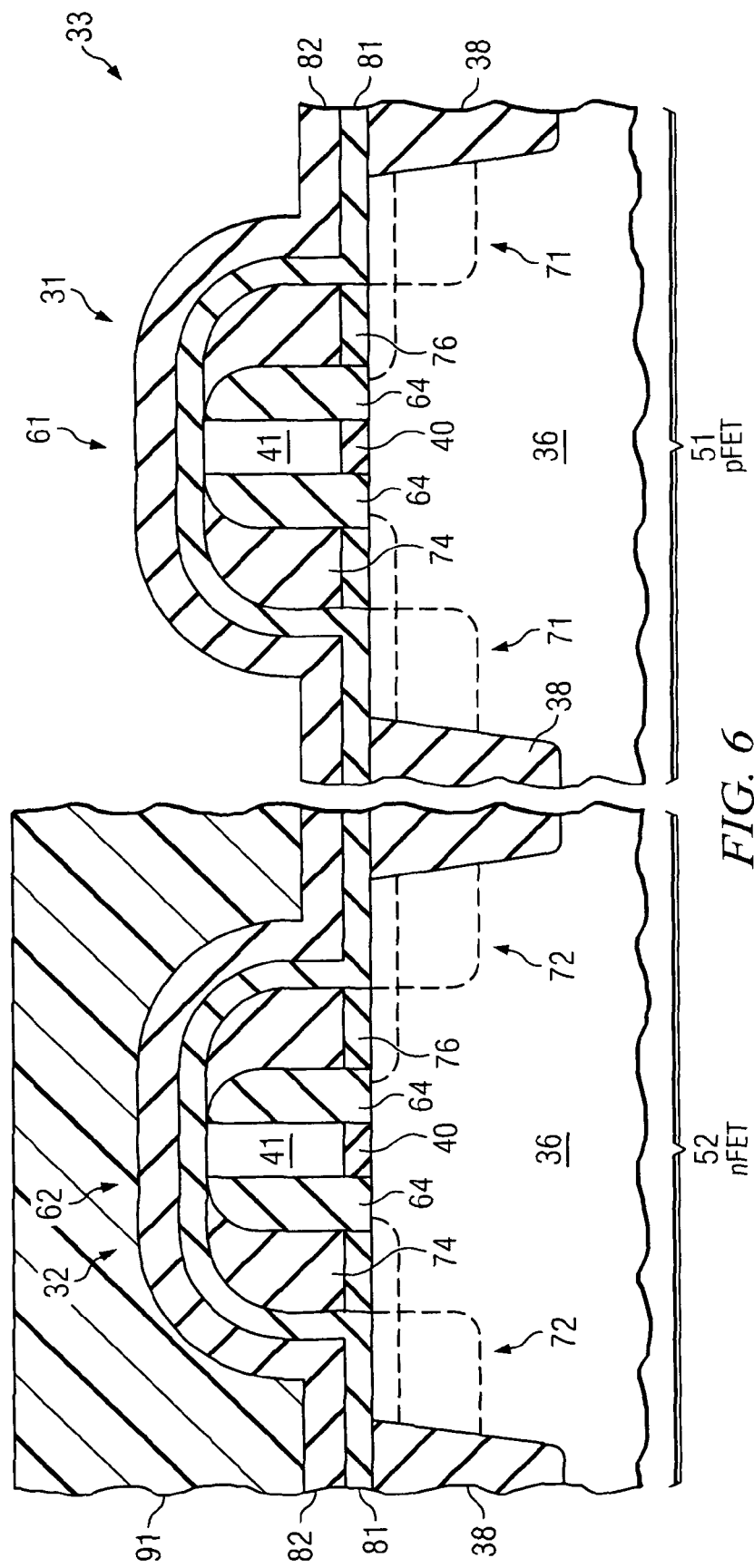
Figure 7:
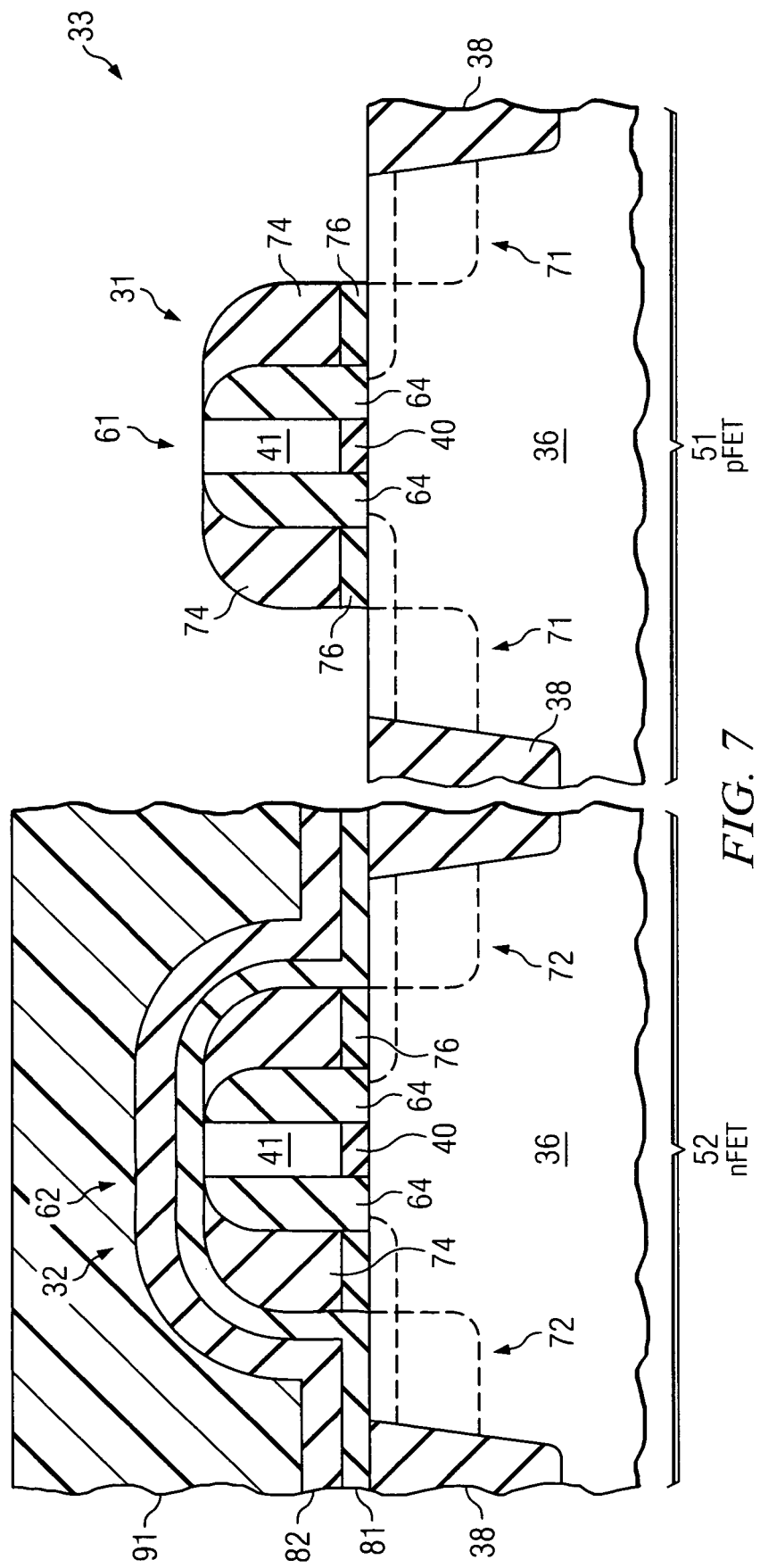

In FIG. 6, a first oxide layer 81 is formed over the substrate 36, the spacer structures 64, 74, and the gate stacks 61, 62. The first oxide layer 81 may be deposited using a CVD LTO process, for example. Next, a nitride layer 82 is formed on the first oxide layer 81. The nitride layer 82 and the first oxide layer 81 may be formed using any suitable process (currently known or later developed). As shown in FIG. 6, a first patterned mask layer 91 is formed over the nFET region 52, which may be a photoresist mask formed using photolithography for example. With the first patterned mask layer 91 in place, the nitride layer 82 is etched at the pFET region 51. Preferably, this nitride etch is at least partially selective against etching oxide material so that the first oxide layer 81 may act as an etch stop layer or at least an etch buffer layer. The nitride etch may be a chemical downstream etch (CDE), for example. Next, the first oxide layer 81 is removed from the pFET region 51. Preferably, this etch of the first oxide layer 81 leaves the source/drain regions 71 and the first gate electrode material 41 exposed at the pFET region 51, as shown in FIG. 7.

Figure 8:
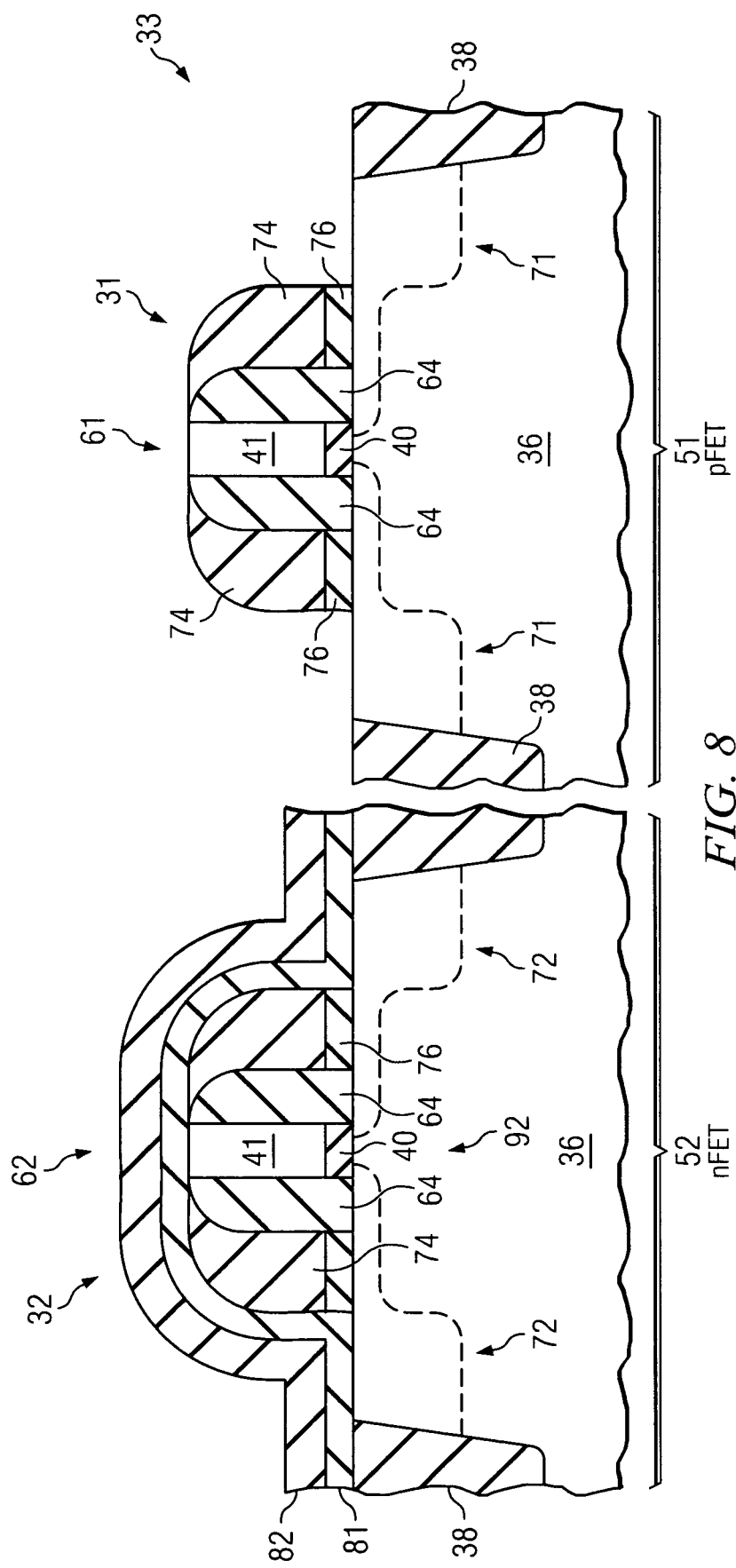

After removing the nitride layer 82 and the first oxide layer 81 from the pFET region 51, the first patterned mask layer 91 (see FIG. 7) is removed (e.g., resist strip/clean process), as shown in FIG. 8. After removing the first patterned mask layer 91, a recrystallization anneal (e.g., spike anneal or laser annealing) may be performed to recrystallize the substrate 36 at the nFET region 52 while the nitride layer 82 and the first oxide layer 81 are still in place. This may also cause a tensile strain transferred in the nFET channel region 92 (for stress memory technology (SMT) to improve nFETs performance) when the nitride layer 82 is removed later. It is optional to perform this recrystallization anneal at this stage (but it may be preferable) because there will be other opportunities later in the process to recrystallize the substrate 36 at the nFET region 52 while the nitride layer 82 is still present.

Figure 9:
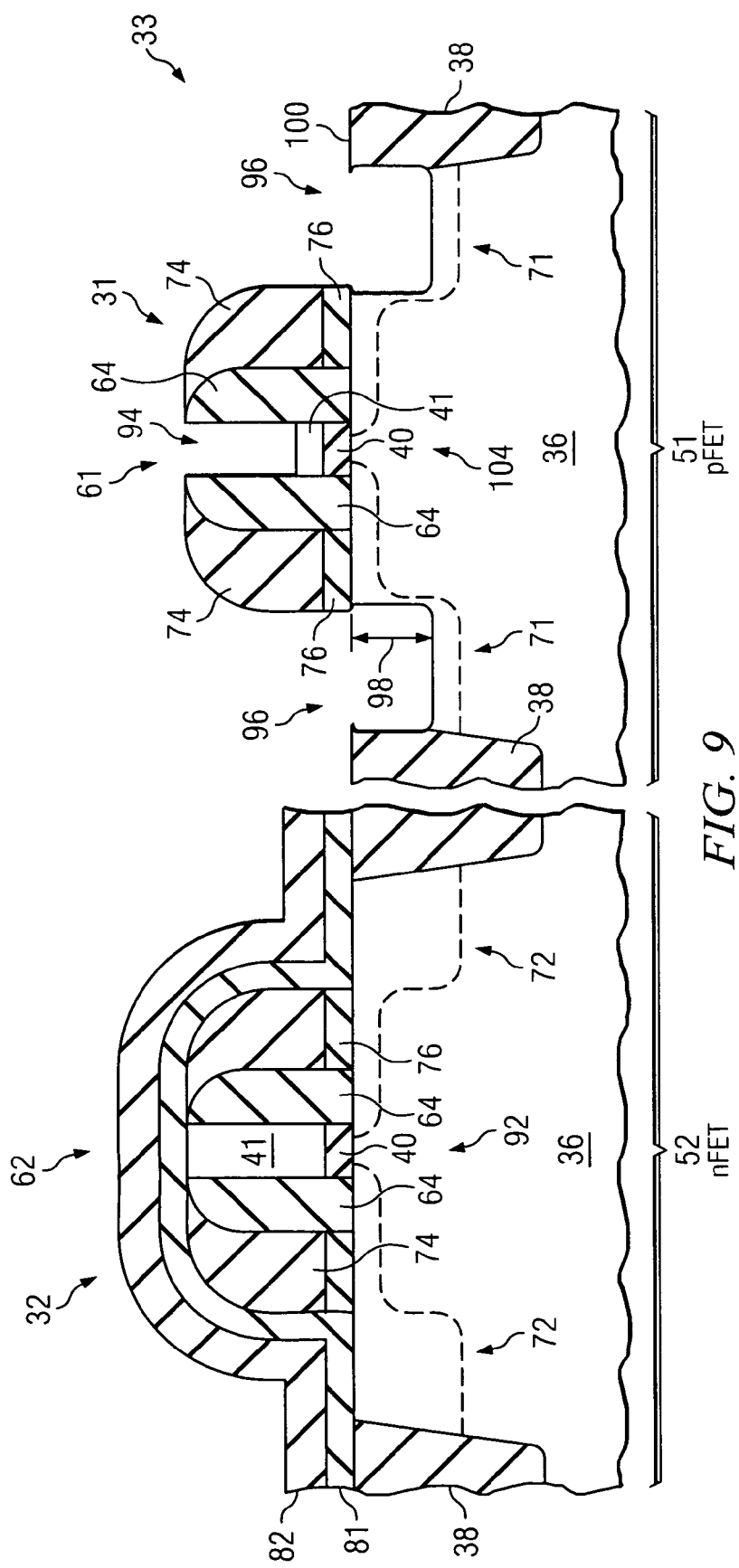

In FIG. 9, an etching process has been performed on the source/drain regions 71 of the substrate 36 at the pFET region 51 and at the first gate electrode material 41 of the first gate stack 61 (at the pFET region 51). Preferably, this etching is at least partially selective against etching nitride and oxide materials so that it mostly or only etches semiconductor material, i.e., the first gate electrode material 41 and the exposed substrate 36 in this case. This etching may be an anisotropic, isotropic or combination of iso- and aniso-tropic RIE etch, for example. Wet Si etching is not excluded. The nFET region 52 is shielded by the nitride layer 82. With the etching being at least partially selective against etching nitride and oxide materials, the spacer structures 64, 74 of the pFET region 51 will at least partially remain. As shown in FIG. 9, at least part of the first gate electrode material 41 is removed by the etching from the first gate stack 61 (in the pFET region 51) to form a gate electrode recess 94. Also, source/drain recesses 96 are formed by the etching in the source/drain regions 71 of the substrate 36 at the pFET region 51 (see FIG. 9).

In the embodiment shown in FIG. 9, part of the first gate electrode material 41 remains at the gate electrode recess 94. This may be preferred to allow for a new gate electrode material to be grown easier (e.g., using a selective epitaxial growth (SEG) process). Because most gate electrodes are typically much narrower than the source/drain regions, the etching rate will typically be slower for the first gate electrode material 41 than for the source/drain regions 71. This is another reason that there may be first gate electrode material 41 remaining at the gate electrode recess 94. If the width of the source/drain regions 71 is more similar to the width of the first gate stack 61, the first gate electrode material 41 may etch at about the same rate as the source/drain regions 71. Hence, the etch rate for each portion is feature size dependent. In a preferred embodiment, the source/drain recesses 96 have a depth 98 in a range from about 40 nm to about 100 nm from the top surface 100 of the substrate 36, for example. In other embodiments, however, the source/drain recesses 96 may be formed with any suitable depth.

In some other processes, a nitride cap layer (not shown) is formed over the first gate stack 61 to prevent the first gate stack 61 from being etched while forming the source/drain recesses 96. This requires several extra steps to form, pattern, and later remove such a nitride cap layer. Thus, an advantage of an embodiment of the present invention is that these steps of forming, patterning, and later removing a nitride cap layer over the first gate stack 61 may be eliminated from the process flow.

Figure 10:
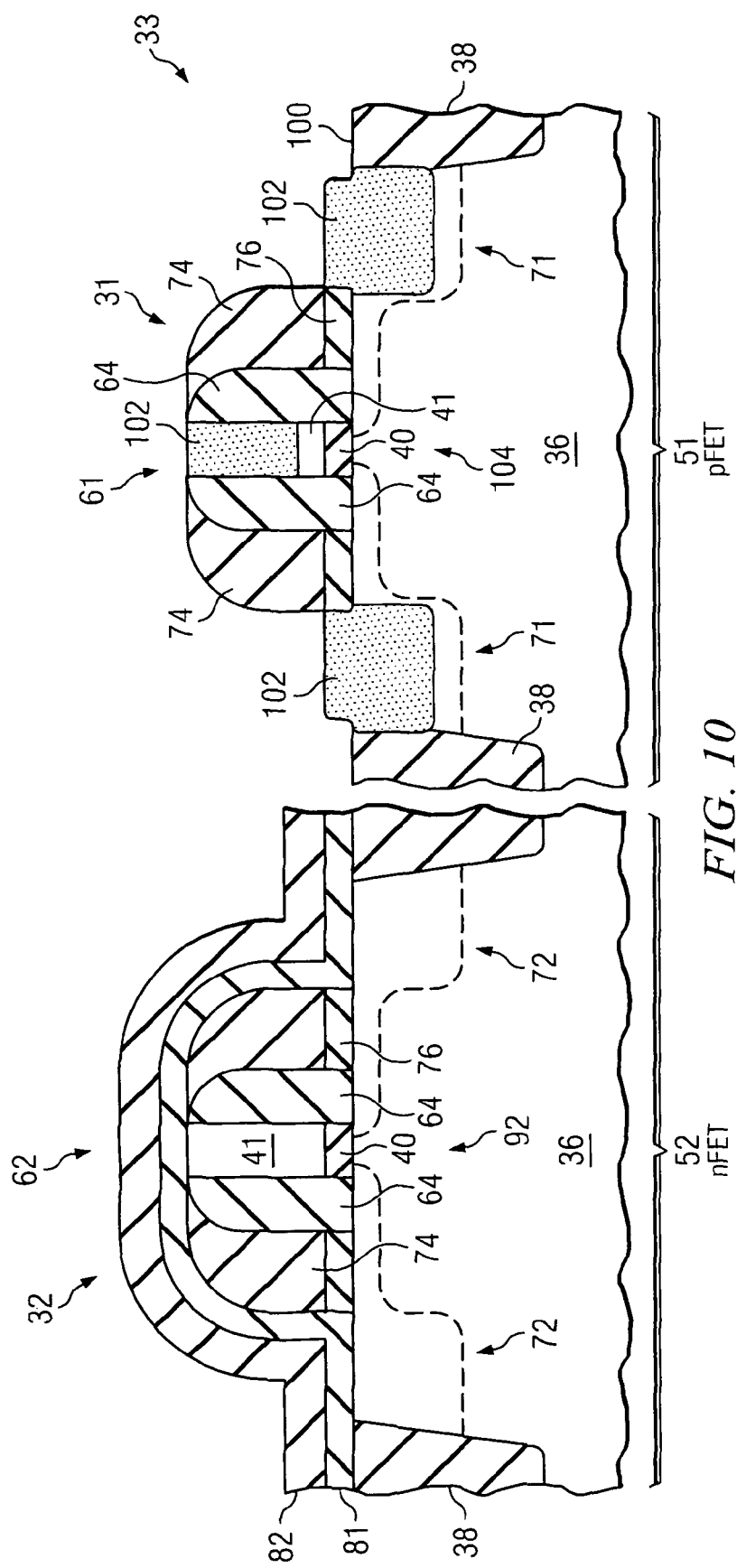

As shown in FIG. 10, a SiGe material 102 is epitaxially grown in the source/drain recesses 96 and in the gate electrode recess 94 at the pFET region 51. Preferably, this SiGe material 102 is in-situ doped with boron (B) during the growth. Hence, the SiGe material 102 grown in the source/drain recesses 96 and the gate electrode recess 94 is already doped upon formation. Preferably, the growth of the SiGe material 102 is a selective epitaxial growth process so that SiGe material 102 is not formed on the nitride and oxide materials of the nitride layer 82, the spacer structures 64, 74, and the isolation regions 38. Because part of the first gate electrode material 41 remains in the gate electrode recess 94, a selective epitaxial growth process may be used. The SiGe material 102 that grows in the source/drain recesses 96 will likely be single crystalline with the same crystal structure as the substrate 36 (e.g., 110 or 100 orientation). And the SiGe material 102 that grows on the remaining portion of the first gate electrode material 41 in the gate electrode recess 94 will likely be polycrystalline with the same polycrystalline structure as the first gate electrode material 41.

Just as the etching rate was feature size dependent (comparing the gate electrode recess 94 to the source/drain recesses 96), the growth rate is likewise feature size dependent. If the first gate stack 61 is narrower than the source/drain regions 71, it may have a slower growth rate or may be adjustable to slower growth rate. It is desirable to at least fill the source/drain recesses 96 with the embedded SiGe material 102 to maximize compressive strain on the pFET channel region 104. As shown in FIG. 10, it is preferred to slightly overfill the source/drain recesses 96 because some of the SiGe material 102 will be consumed later down the line during silicidation processing. It may be preferred to adjust the overfill of the embedded SiGe material 102 in the source/drain recesses 96 so that the silicide (not shown) is flush with the top surface 100 of the substrate 36 after the silicidation of the source/drain regions 71. But in other embodiments (not shown), the embedded SiGe material 102 may be flush with the top surface 100 of the substrate 36 or underfilled in the source/drain recesses 96. Similarly, it is preferred to completely fill the gate electrode recess 94, as shown in FIG. 10, but the gate electrode recess 94 may be overfilled, flush filled, or underfilled in other embodiments (not shown). The embedded SiGe material 102 in the gate electrode recess 94 (in the first gate stack 61) may also contribute to compressively straining the pFET channel region 104 of the pFET region 51.

After forming the SiGe material 102 in the source/drain recesses 96 and the gate electrode recess 94, as shown in FIG. 10, it is preferable to implant boron ions. Because the nitride layer 82 is over the nFET region 52, no additional masking is needed for this boron implant step, which is another advantage of the first embodiment. This boron implant is preferably a light dose to prevent relaxation of the embedded SiGe material 102 in the source/drain recesses 96 (and in the gate electrode recess 94). Because the embedded SiGe material 102 already includes in-situ boron doping, the boron implant may be a light dose. One of the advantages of using SiGe for the pFET gate electrode is that SiGe can be more heavily doped with boron than polysilicon, which provides lower resistance and greater conductance for the gate electrode. After the boron implanting, it is preferable to perform a spike anneal to activate the boron doping, to recrystallize regions getting boron implanting, and to promote compressive strain on the pFET channel region 104. This spike anneal is an optional step here because the pFET region 51 may be annealed at a later stage in combination with another heat treatment. Alternatively, the annealing step performed at this stage may also be used to anneal the nFET region 52 (if not already annealed in a previous step).

Figure 11:
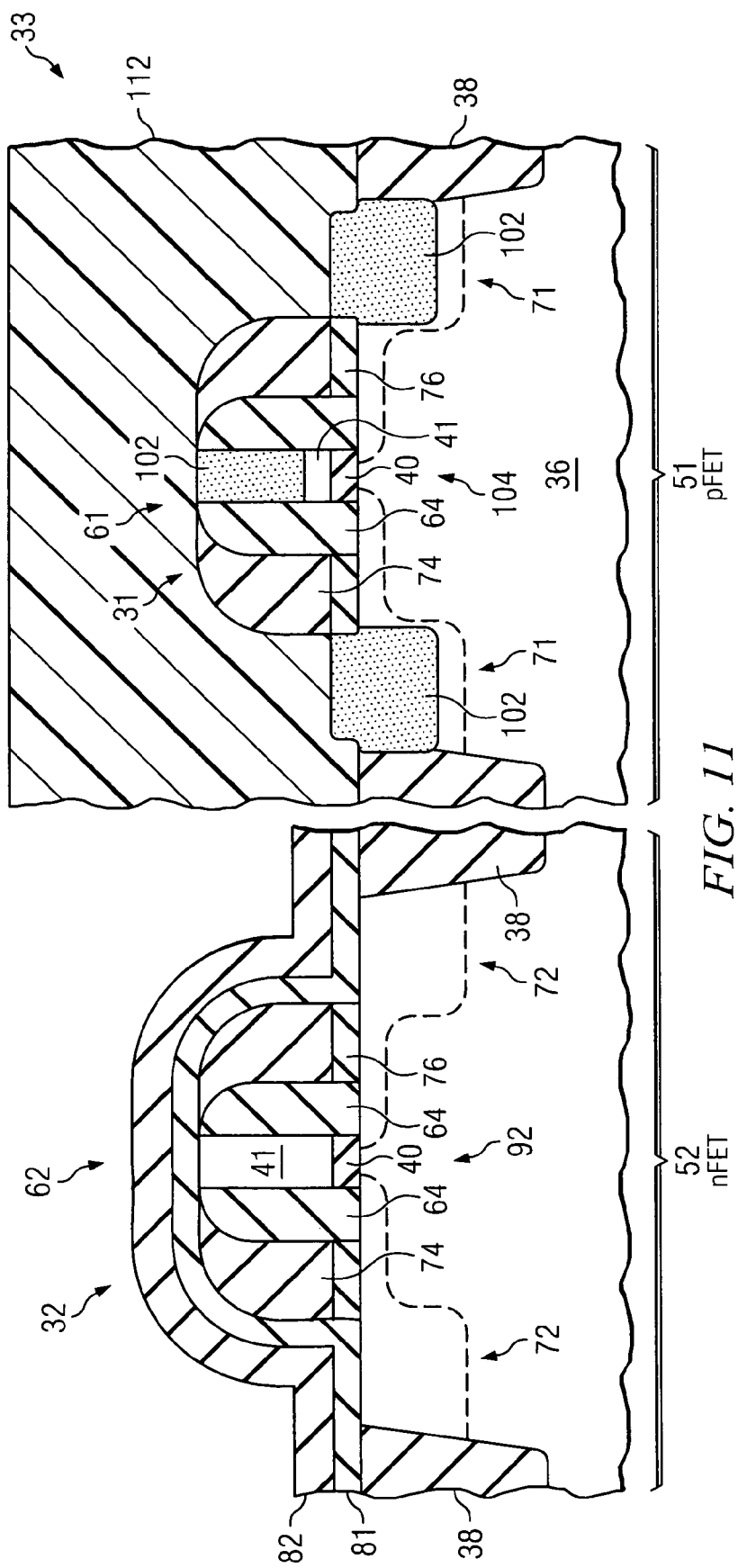
Figure 12:
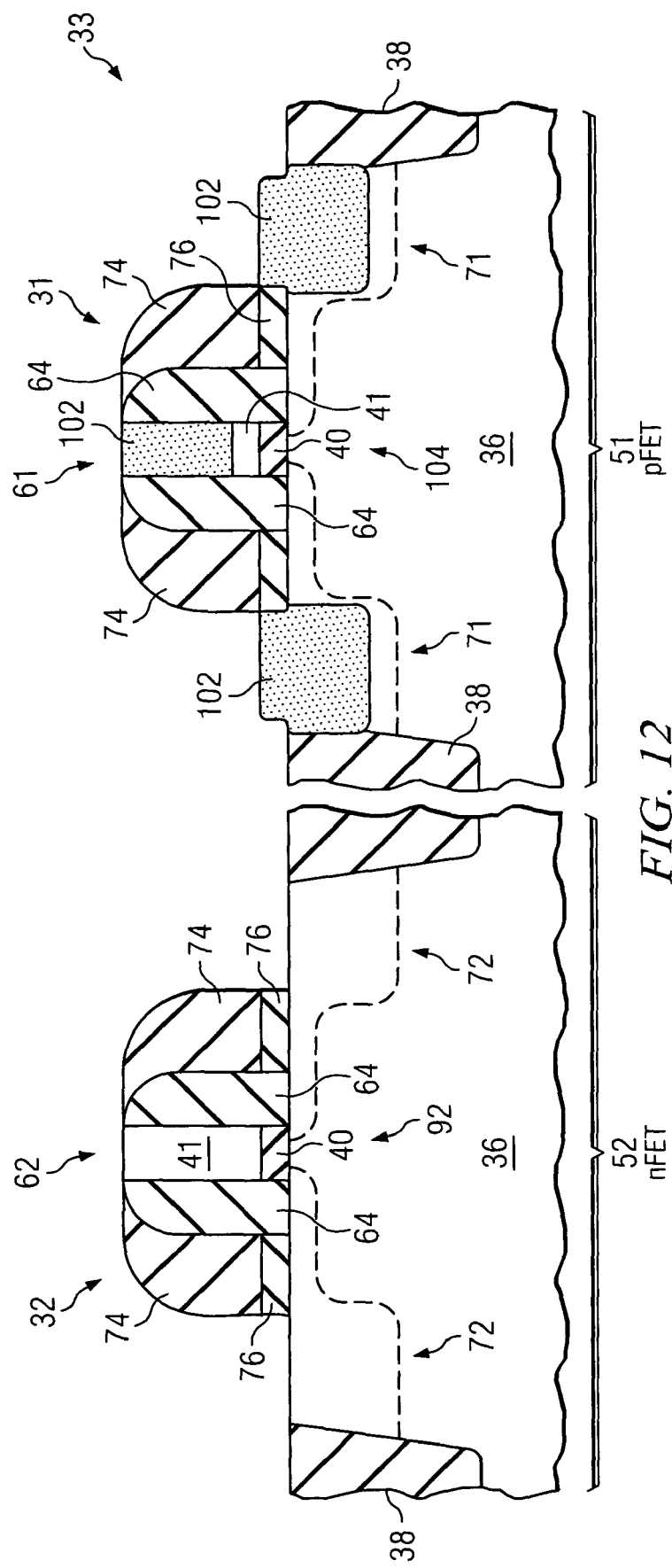

As shown in FIG. 11, a second patterned mask layer 112 is formed over the pFET region 51 to protect the pFET region 51 during the removal of the nitride layer 82 and the first oxide layer 81 from the nFET region 52. The process and steps used to remove the nitride layer 82 and the first oxide layer 81 from the nFET region 52 may be the same as that discussed above regarding FIGS. 7 and 8, for example. In FIG. 12, the nitride layer 82, the first oxide layer 81 (SMT process is simultaneously completed while the nFETs hard mask is removed), and the second patterned mask layer 112 have been removed. The steps used to complete the pFET 31 and nFET 32 and to connect them to other lines and devices subsequent to the structure shown in FIG. 12 (e.g., silicidation, contact formation, IMD layers, metallization interconnects, etc.) may include any suitable conventional or later develop manufacturing processes.

FIG. 13 shows a simplified schematic of a transistor 120 with Cartesian coordinates drawn thereon. These Cartesian coordinates (X direction, Y direction, and Z direction) will be used as reference directions for the following discussion regarding strains on the pFET 31 and nFET 32 of the first embodiment (see FIG. 12). For the pFET 31, compressive strain in the X direction (which is most sensitive for a pFET) is improved or increased (e.g., about 7.2% or more) using the first illustrative method of FIGS. 1-12. This strain on the pFET 31 is induced by the formation of the embedded SiGe material 102 in the source/drain recesses 96, in combination with an anneal step. There also may be a slight increase (e.g., about 0.1%) in the tensile stain in the Y direction in the pFET 31. Although increasing tensile stain in Y direction for a pFET is typically undesirable, the amount of increase by using the first illustrative embodiment of FIGS. 1-12 is negligible and probably will not affect performance in a substantial way. Hence, the improvement of the compressive strain in the X direction for the pFET 31 should substantially outweigh any negligible effects due to a very slight increase in tensile strain in the Y direction for the pFET 31.

FIGS. 14-17 show some illustrative steps for a second illustrative method embodiment of the present invention. The second method embodiment may be the same as the first method embodiment for the initial steps shown and discussed above with regards to FIGS. 1-10. Referring again to FIG. 10, after the SiGe material 102 is formed in the source/drain recesses 96 and the gate electrode recess 94 of the pFET region 51, and after the additional boron implant (if needed), a third patterned mask layer 123 (e.g., photoresist) is formed to mask the pFET region 51, as shown in FIG. 14. With the pFET region 51 shielded by the third patterned mask layer 123, particles are implanted into the nFET region 52 to make at least part of the source/drain regions 72 amorphous at the nFET region 52. These particles may be any suitable particles, preferably heavy particles capable of amorphizing (breaking bonds and lattice structures of the silicon) the gate electrode and the source/drain regions 72 of the nFET region 52, including (but not limited to): germanium, xenon, arsenic, silicon, or combinations thereof, for example. In a preferred use of the second method embodiment, germanium may be used for this amorphizing implant, for example.

Figure 15:
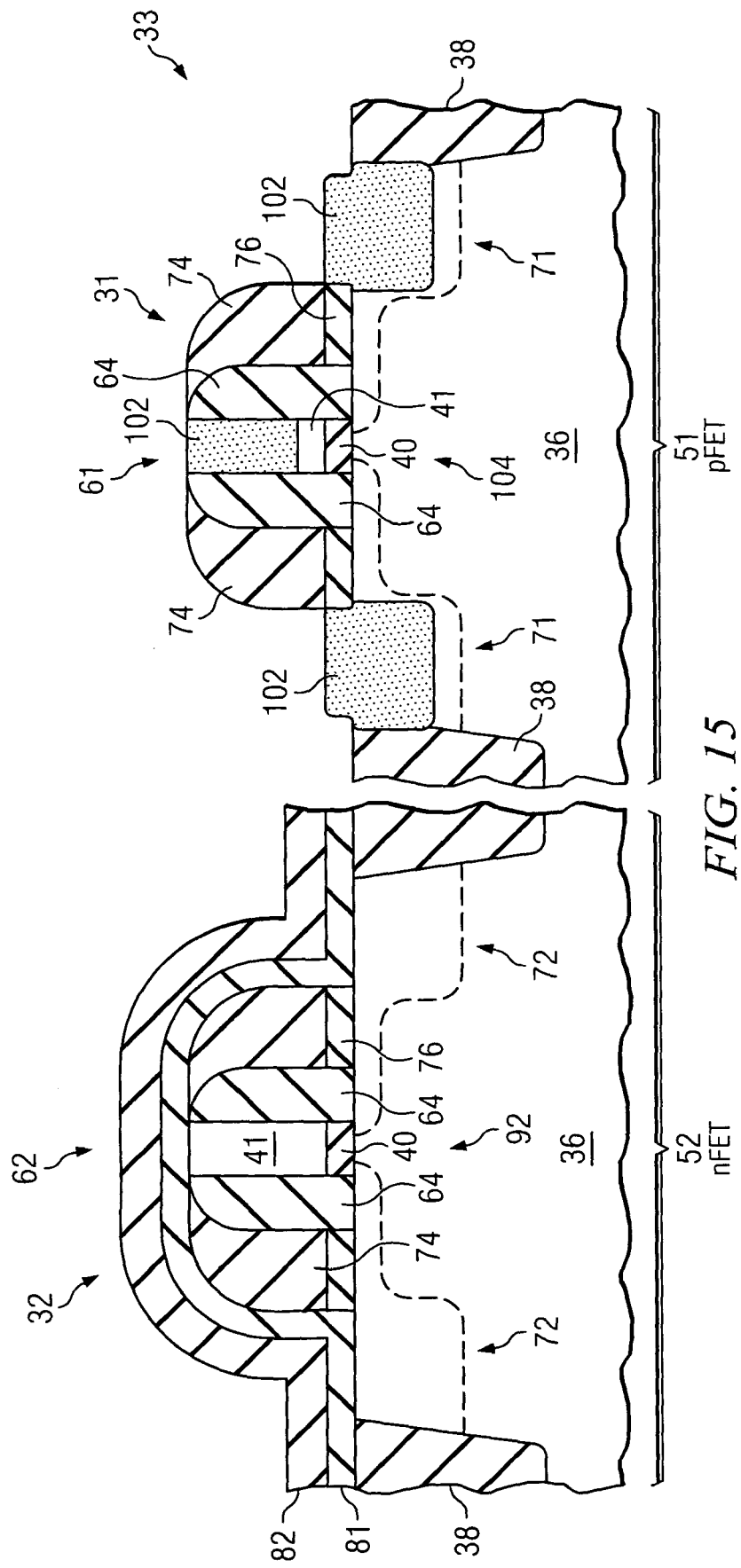

Next, as shown in FIG. 15, the third patterned mask layer 123 is removed (e.g., photoresist strip/clean). With the third patterned mask layer 123 removed, the intermediate structure of FIG. 15 is then annealed (preferable spike annealing, but not limited to, laser annealing and others are options may be used as well) to activate the boron doping in the pFET 31 (as discussed regarding FIG. 10 above) and to recrystallize the nFET 32 creating tensile strain in the nFET channel region 92 (for SMT) after the nitride layer 82 is removed. Although an optional part of the process flow, the implanting of the germanium particles in the nFET region 52 enhances the amount of strain induced on the nFET 32 (for better SMT).

Figure 16:
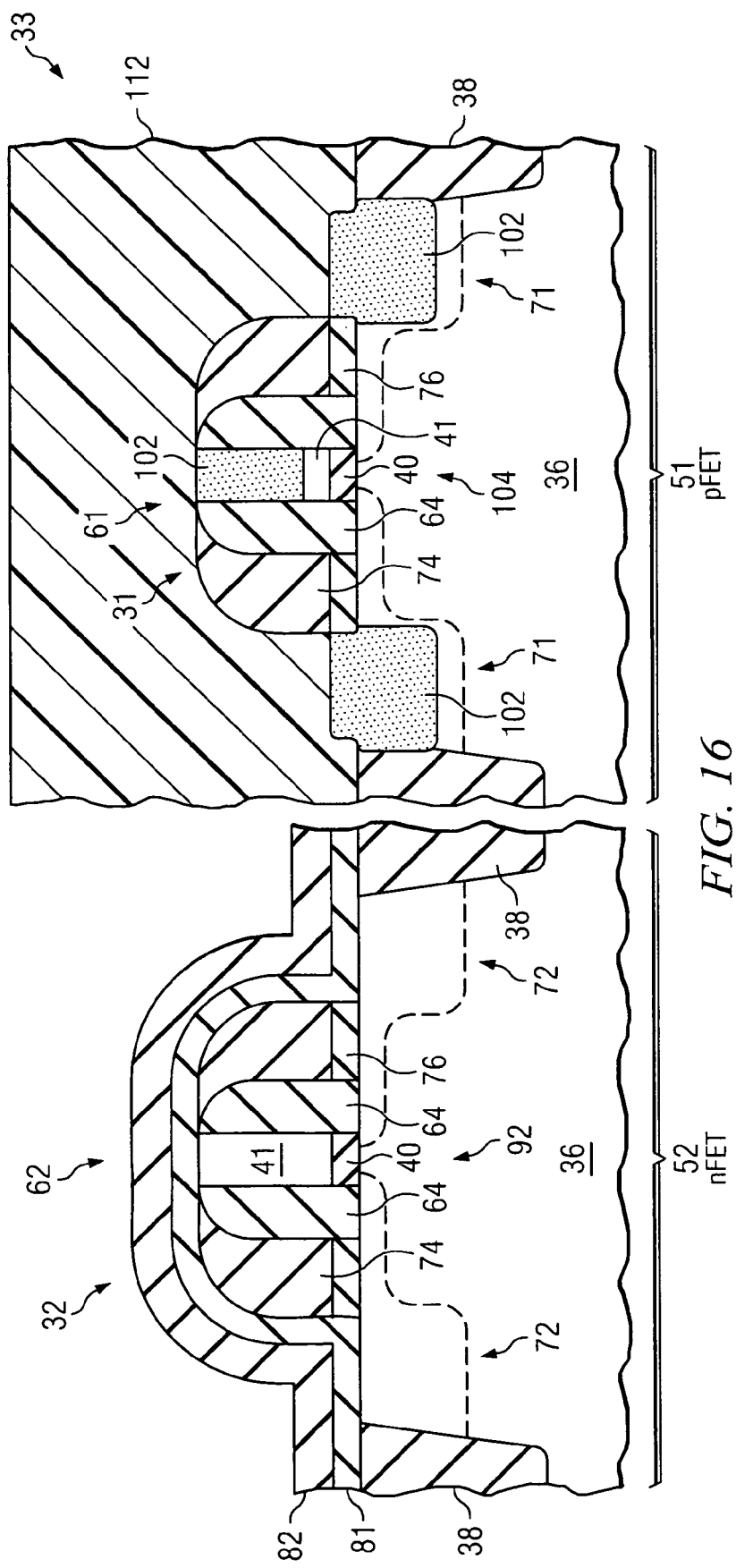
Figure 17:
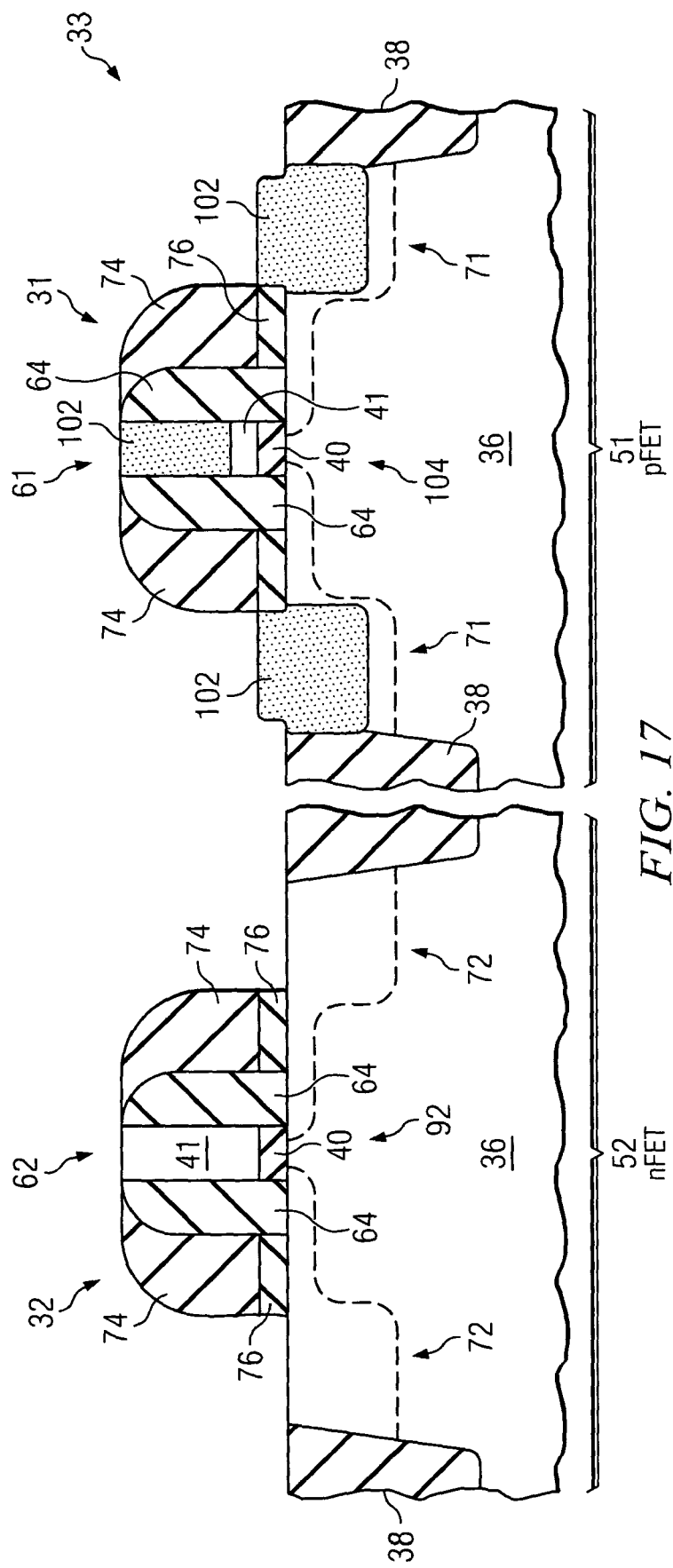

Next for the second method embodiment, the nitride layer 82 and first oxide layer 81 are removed from the nFET region 52, as illustrated in FIGS. 16 and 17. Note that FIGS. 16 and 17 are essentially the same as FIGS. 11 and 12, because the implanted germanium particles are not shown in FIGS. 16 and 17 (simplified drawings for illustrative purposes). The process and steps for removing the nitride layer 82 and the first oxide layer 81 for the second method embodiment may be the same as those steps described above regarding FIGS. 11 and 12, for example.

Figure 18:
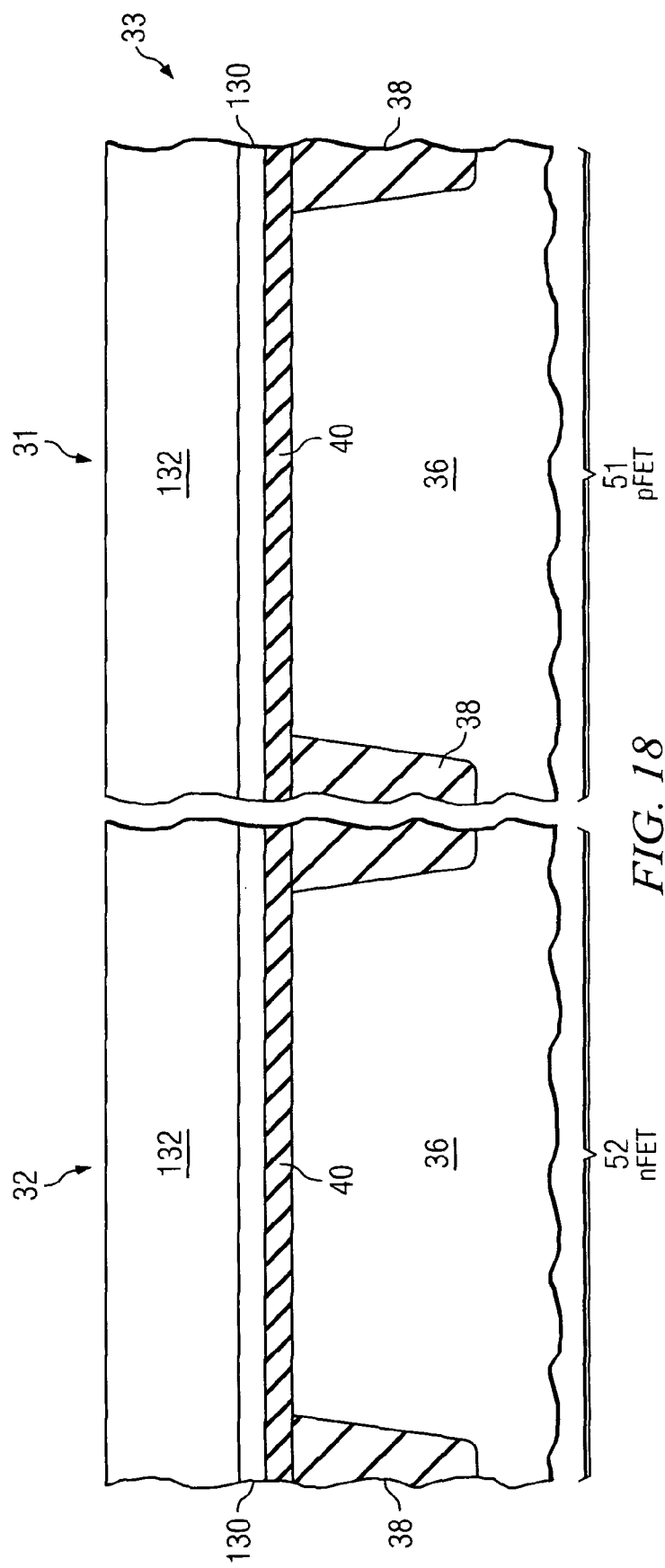
FIG. 18 shows an illustrative step for a third illustrative method embodiment of the present invention.

FIG. 18 shows an illustrative step for a third illustrative method embodiment of the present invention. The third method embodiment may be the same as the first method embodiment or the second method embodiment, except that the gate stacks 61, 62 include different materials initially. In other words, FIG. 18 may be substituted for FIG. 1 to create a variation on the first and second method embodiments. In FIG. 18, a polycrystalline silicon layer 130 has been formed on the gate dielectric material 40, and a polycrystalline SiGe layer 132 has been formed on the polycrystalline silicon layer 130. Although the polysilicon layer 130 may be any desirable thickness for the third method embodiment, preferably, the polysilicon layer 130 is just thick enough to provide a uniform and continuous coverage of the gate dielectric material 40. An advantage of using a thin layer of polysilicon 130 sandwiched between the poly-SiGe material 132 and the gate dielectric material 40 is that it allows the poly-SiGe material 132 to be more easily grown (e.g., using epitaxial growth) on the polysilicon 130 rather than directly on the gate dielectric material 40. Also, conventional processes already developed and refined for depositing polysilicon 130 on gate dielectric material 40 may be utilized to provide easier integration into an existing process flow. The result is that the first and second gate stacks 61, 62 will have the poly-SiGe material 132 on the polysilicon 130 for the initial gate stack structures 61, 62 (not shown with polysilicon 130 and poly-SiGe 132), rather than only polysilicon 41 as shown in FIG. 3.

Figure 19:
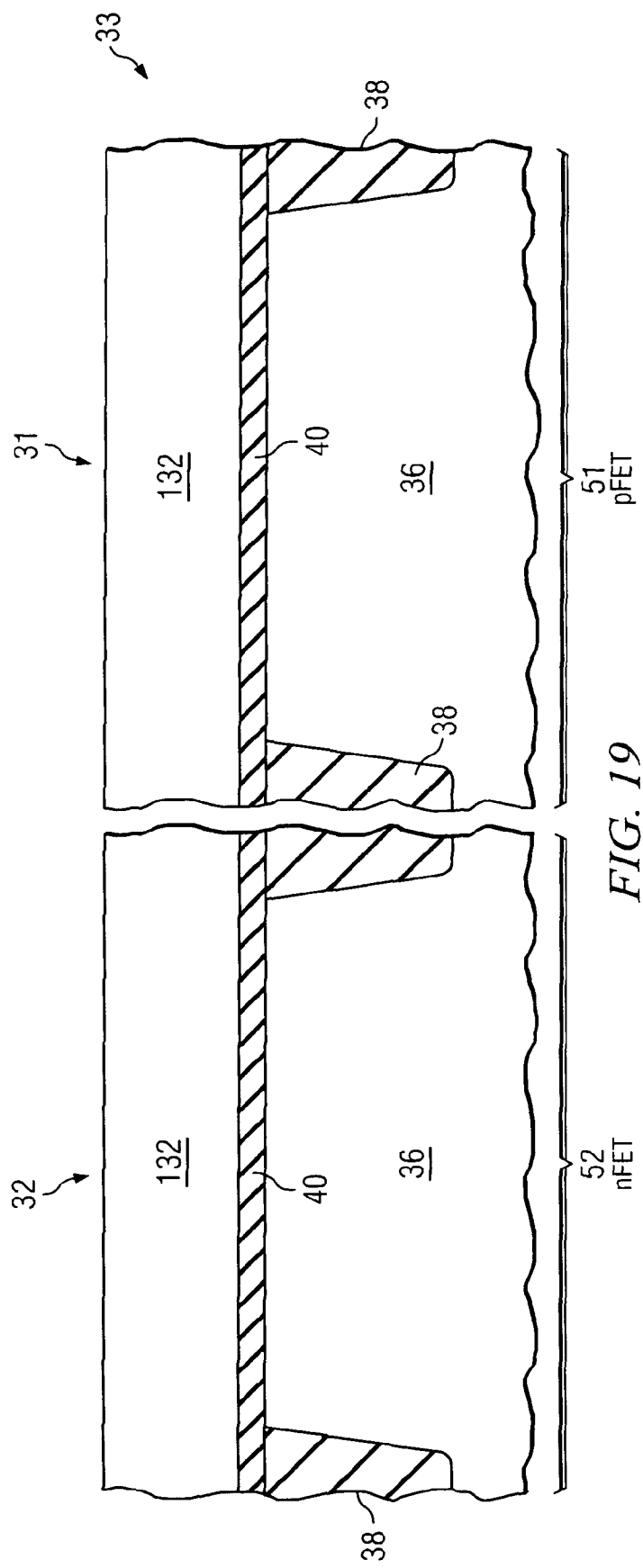
FIG. 19 shows an illustrative step for a fourth illustrative method embodiment of the present invention.

FIG. 19 shows an illustrative step for a fourth illustrative method embodiment of the present invention. Like the third method embodiment, the fourth method embodiment may be the same as the first method embodiment or the second method embodiment, except that the gate stacks 61, 62 include different materials initially. In other words, FIG. 19 may be substituted for FIG. 1 to create a variation on the first and second method embodiments. In FIG. 19, a polycrystalline SiGe layer 132 has been formed directly on the gate dielectric material 40. The result is that the first and second gate stacks 61, 62 will have the poly-SiGe material for the first gate electrode material 41 in the initial gate stack structures, rather than only polysilicon as shown in FIG. 3.

There are several advantages of using SiGe for the first gate electrode material and for using SiGe in the first gate stack 61 of the pFET 31 that may be realized. The poly-SiGe 132 formed in FIG. 18 or 19 may be doped in-situ with boron (pre-doped) as the SiGe is formed. Poly-SiGe material generally has a higher saturation level for boron than polysilicon, which allows for higher boron doping concentrations. Higher boron doping in the gate electrode material provides more conductivity and lower resistance (more similar to metal), which are beneficial for a gate electrode. Also, another advantage of having SiGe material in the gate electrode(s) of the pFET and/or nFET is that the MOSFET performance is enhanced by reducing poly depletion effects (PDE) (due to the higher dopant solubility of SiGe). The use of SiGe in the gate electrode(s) of the pFET and/or nFET may also improve the amount of strain induced on the channel region(s). For example, using SiGe for the gate electrode material of the second gate stack 62 of the nFET 32 may improve the compressive strain in the Y direction (which is most sensitive for an nFET) (see FIG. 13 for direction reference). Because SiGe has a smaller Young's modulus than polysilicon (i.e., poly-SiGe is relatively more ductile than polysilicon), SiGe is better for transferring strain to the channel regions of the transistors than polysilicon.

Furthermore, the use of embedded SiGe 102 in the pFET 31 of an embodiment may allow for $V_t$ tuning (by Ge concentration control in SiGe gate electrode). An advantage of the first, second, and third embodiments is that the SiGe can be grown on the polysilicon. It is sometimes difficult to grow poly-SiGe on amorphous gate dielectric material. Note also that an embodiment of the present invention allows the nitride layer 82 to be used to mask and protect the nFET region 52 during growth of the SiGe material 102 (FIG. 10) while also being used to induce strain on the nFET channel region 92 (for SMT). Furthermore, by eliminating the need for a nitride cap layer on the pFET gate electrode, the RIE controllability may be improved.

Figure 20:
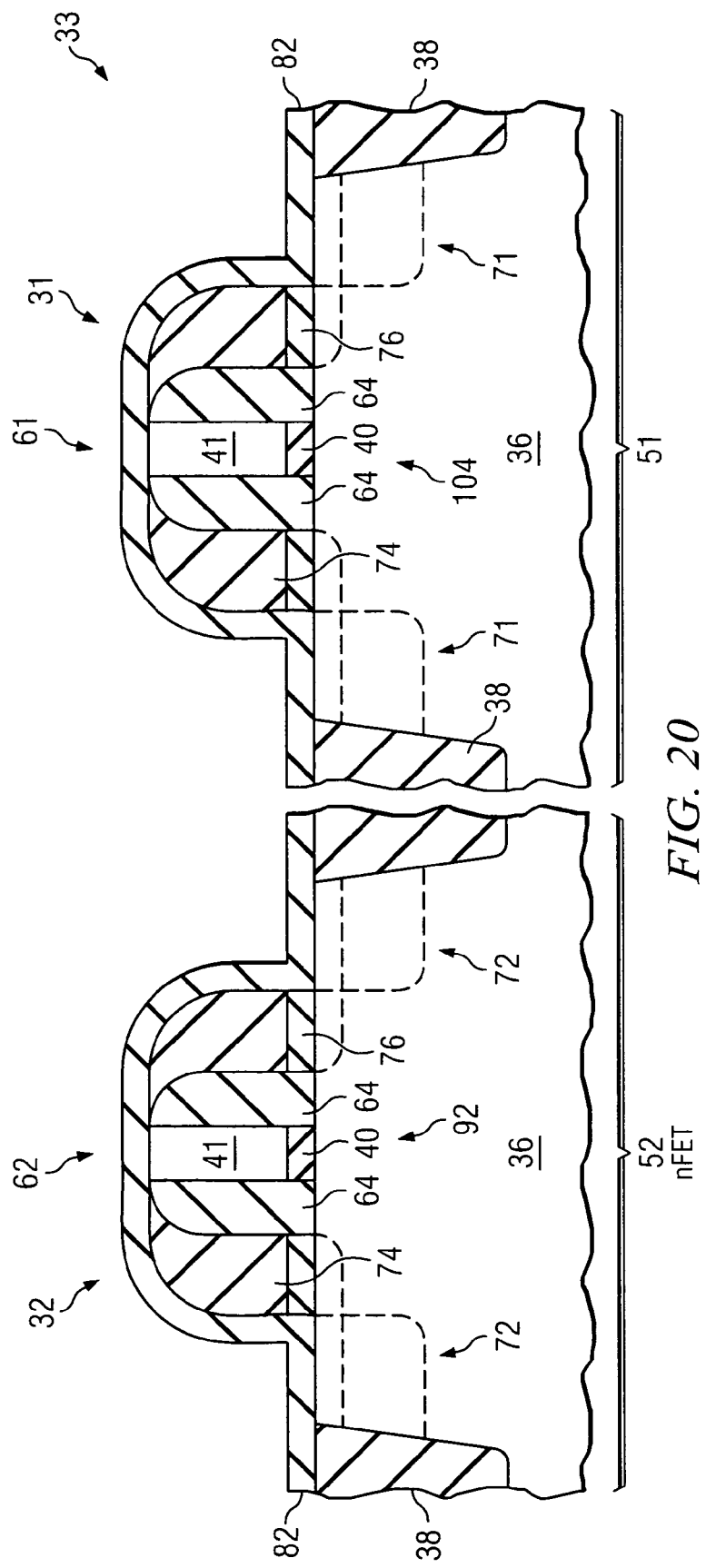
FIGS. 20-21 show some illustrative steps for a fifth illustrative method embodiment of the present invention.
Figure 21:
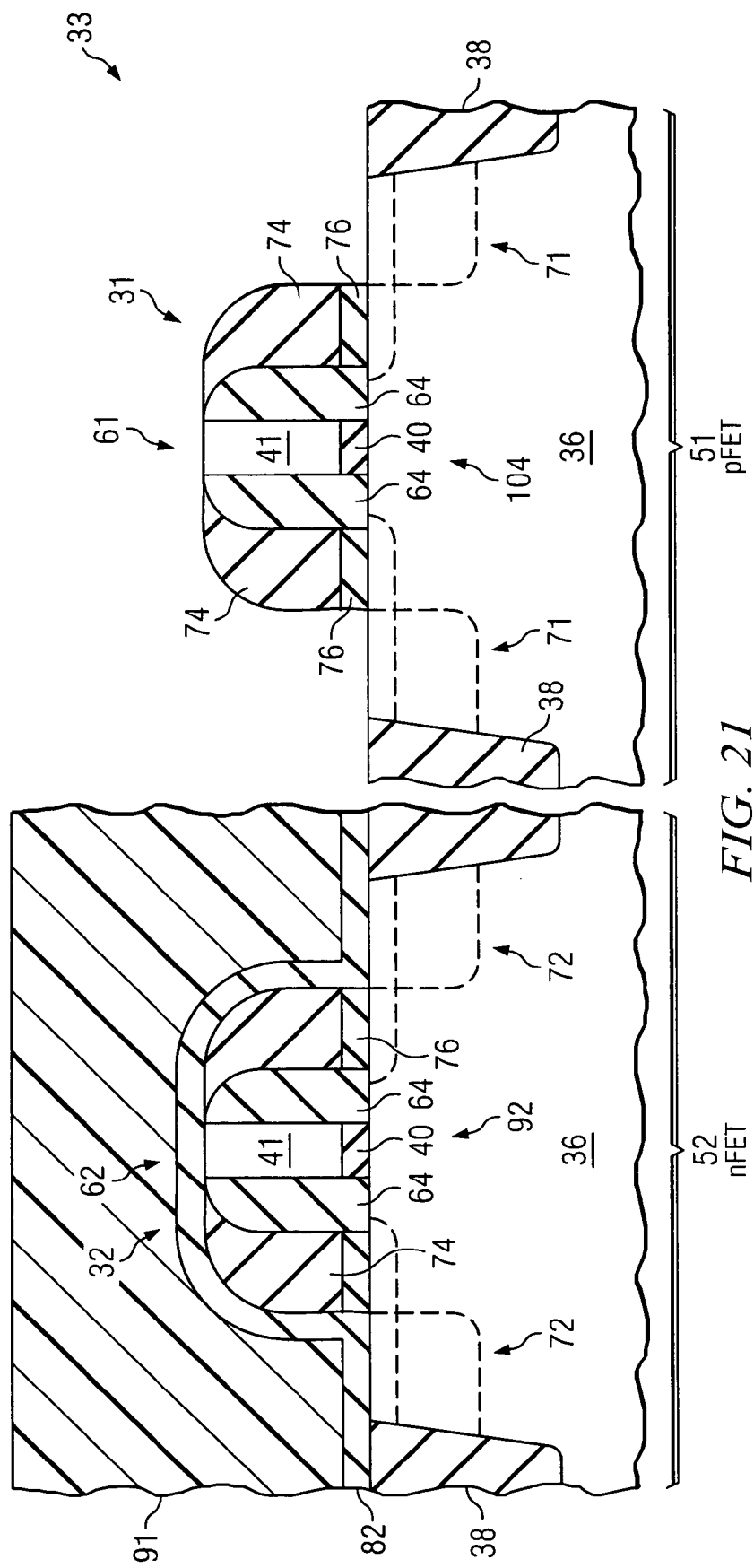

FIGS. 20-21 show some illustrative steps for a fifth illustrative method embodiment of the present invention. The fifth method embodiment may be the same as the first, second, third, or fourth method embodiments discussed above, except that the etch stop layer 81 (see FIG. 6) and steps associated with the etch stop layer 81 may be deleted. Although it is preferred to use the etch stop layer 81 as discussed above regarding the first embodiment, it is possible to alter the first, second, third, or fourth method embodiments to forgo the use of the etch stop layer 81. The fifth method embodiment may be the same as the first, second, third, or fourth method embodiments for the initial steps shown and discussed above with regards to FIG. 1-10 (or 18 to 2-10, or 19 to 2-10). Referring again to FIG. 10, after gate stacks 61, 62 are formed and the spacer structures 64, 74 are formed, the tensile-stress-inducing mask layer 82 is formed on over them as shown in FIG. 20 for the fifth embodiment. As shown in FIG. 21, the nFET region 52 is masked (e.g., patterned photoresist) while the tensile-stress-inducing mask layer 82 is removed from the pFET region 51 (compare to FIG. 7 of the first embodiment). Then the process flow may continue at FIG. 8 for the fifth embodiment, but without the use of the etch stop layer 81 shown in FIG. 8. During certain steps, the etching chemicals, etching process, etch stop control, or any of these combined, may need to be altered to prevent overetching or damage to the underlying structures while etching or patterning the tensile-stress-inducing mask layer 82 The use of the etch stop layer 81 as illustrated in the first, second, third, and fourth embodiments will likely be preferred to provide a better etch control.

In the embodiments discussed above, although the gate dielectric material 40 is shown as being the same for the pFET 31 and the nFET 32 (which will often be fine), the gate dielectric material 40 may differ in material and/or structure (e.g., multiple layers, layer thickness, EOT, etc.) for the pFET 31 and the nFET 32, without departing from the scope of the present invention as defined by the appended claims.

The embodiments discussed above may be useful in 45 nm and beyond technology because strain in nFETs and pFETs is an important factor. The embodiments described above and other embodiments (not shown) of the present invention may address former issues in attempting to implement SiGe and proper strains in the channel regions of the transistors, while also reducing PDE and possibly providing more ability to tune the gate electrode in conjunction with the source/drain regions for $V_t$ tuning.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification (i.e., SiC for nFETs can be used similar process scheme as SiGe for pFETs for both gate and S/D areas; gate electrode in FIG. 18 can be multi-layers, such as poly Si/SiC/Si). As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising a p-type field effect transistor (pFET) and an n-type field effect transistor (nFET), wherein the pFET comprises:
   an embedded SiGe source/drain material formed in source/drain recesses at source/drain regions of a substrate for the pFET;
   a first gate stack comprising an embedded SiGe gate electrode material, the embedded SiGe gate electrode material being a same material as the embedded SiGe source/drain material;
   a poly-SiGe layer disposed under the embedded SiGe electrode material of the first gate stack; and
   a first spacer structure extending along sidewalls of the first gate stack, and wherein the nFET comprises:
      a second gate stack comprising the poly-SiGe layer disposed over the substrate, and
      a second spacer structure extending along sidewalls of the second gate stack.

2. The semiconductor device of claim 1, wherein the first gate stack further comprises
   a first gate stack material formed on a gate dielectric material, wherein the embedded SiGe gate electrode material is grown on the first gate stack material, and wherein the embedded SiGe gate electrode material is thicker than the first gate stack material.

3. The semiconductor device of claim 1, wherein the first spacer structure comprises:
   an oxide spacer extending along the sidewalls of the first gate stack;
   an oxide layer formed on the substrate adjacent to the oxide spacer; and
   a nitride spacer formed on the oxide layer and extending along sidewalls of the oxide spacer, such that the oxide spacer is located between the first gate stack and the nitride spacer and such that the oxide layer is located between the nitride spacer and the substrate.

4. The semiconductor device of claim 1, further comprising a poly-silicon layer disposed under the poly-SiGe layer of the second gate stack.

5. The semiconductor device of claim 1, wherein the poly-SiGe layer of the first gate stack comprises a first portion of a blanket poly-SiGe layer, wherein the poly-SiGe layer of the second gate stack comprises a second portion of the blanket poly-SiGe layer.

6. The semiconductor device of claim 5, further comprising a poly-silicon layer disposed under the poly-SiGe layer of the first gate stack.

7. A semiconductor device, comprising:
   a p-type field effect transistor (pFET) comprising
      an embedded SiGe source/drain material foamed in source/drain recesses at source/drain regions of a substrate for the pFET,
      a first gate stack comprising
         a gate dielectric material disposed on the substrate,
         a poly-SiGe layer disposed over the gate dielectric material, and
         an embedded SiGe electrode material disposed on the poly-SiGe layer, the embedded SiGe electrode material being a same material as the embedded SiGe source/drain material, and
      a first spacer structure extending along sidewalls of the first gate stack; and
   an n-type field effect transistor (nFET) nFET transistor comprising
      source/drain regions for the nFET formed by diffused dopants in the substrate,
      a second gate stack comprising
         the gate dielectric material formed on the substrate,
         the poly-SiGe layer disposed over the gate dielectric material, and
      a second spacer structure extending along sidewalls of the second gate stack.

8. The semiconductor device of claim 7, further comprising a poly-silicon layer disposed under the poly-SiGe layer of the first and the second gate stacks.

9. The semiconductor device of claim 7, wherein the first spacer structure comprises:
   an oxide spacer extending along the sidewalls of the first gate stack;
   an oxide layer formed on the substrate adjacent to the oxide spacer; and
   a nitride spacer formed on the oxide layer and extending along sidewalls of the oxide spacer, such that the oxide spacer is located between the first gate stack and the nitride spacer and such that the oxide layer is located between the nitride spacer and the substrate.

10. The semiconductor device of claim 7, wherein the second spacer structure is substantially identical to the first spacer structure.

11. A semiconductor device comprising:
    source/drain regions for a p-type field effect transistor (pFET) having an embedded SiGe source/drain material disposed in source/drain recesses of a substrate;
    a first gate stack disposed between the source/drain regions for the pFET, the first gate stack comprising:
       a first gate dielectric layer disposed on the substrate, and
       an embedded SiGe electrode material disposed over the first gate dielectric layer, the embedded SiGe electrode material being a same material as the embedded SiGe source/drain material;
    a poly-SiGe layer disposed under the embedded SiGe electrode material of the first gate stack;
    a first spacer structure extending along sidewalls of the first gate stack;
    source/drain regions for an n-type field effect transistor (nFET) disposed in the substrate;
    a second gate stack disposed between the source/drain regions for the nFET, the second gate stack comprising:
       a second gate dielectric layer disposed on the substrate, and
       the poly-SiGe layer disposed over the second gate dielectric layer; and
    a second spacer structure extending along sidewalls of the second gate stack.

12. The semiconductor device of claim 11, further comprising a poly-silicon layer disposed under the poly-SiGe layer of the second gate stack.

13. The semiconductor device of claim 11, wherein the poly-SiGe layer of the first gate stack comprises a first portion of a blanket poly-SiGe layer, wherein the poly-SiGe layer of the second gate stack comprises a second portion of the blanket poly-SiGe layer.

14. The semiconductor device of claim 13, further comprising a poly-silicon layer disposed under the poly-SiGe layer of the first gate stack.

15. The semiconductor device of claim 11, wherein the first and the second gate dielectric layers are substantially identical.

16. The semiconductor device of claim 11, wherein the first spacer structure comprises:
    a first oxide spacer extending along the sidewalls of the first gate stack;

a first oxide layer formed on the substrate adjacent to the first oxide spacer; and a first nitride spacer formed on the first oxide layer and extending along sidewalls of the first oxide spacer, such that the first oxide spacer is located between the first gate stack and the first nitride spacer and such that the first oxide layer is located between the first nitride spacer and the substrate.

17. The semiconductor device of claim 16, wherein the second spacer structure comprises:

a second oxide spacer extending along the sidewalls of the second gate stack;

a second oxide layer formed on the substrate adjacent to the second oxide spacer; and a second nitride spacer formed on the second oxide layer and extending along sidewalls of the second oxide spacer, such that the second oxide spacer is located between the second gate stack and the second nitride spacer and such that the second oxide layer is located between the second nitride spacer and the substrate.

* * * * *